(12) United States Patent
Tamanoi et al.

(10) Patent No.: US 8,890,620 B2
(45) Date of Patent: Nov. 18, 2014

(54) POWER AMPLIFIER

(71) Applicant: Fujitsu Limited, Kawasaki (JP)

(72) Inventors: Ken Tamanoi, Yokohama (JP); Toru Maniwa, Setagaya (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/682,394

(22) Filed: Nov. 20, 2012

(65) Prior Publication Data

US 2013/0135053 A1  May 30, 2013

(30) Foreign Application Priority Data

Nov. 24, 2011  (JP) .................................. 2011-255754

(51) Int. Cl.
*H03F 3/04* (2006.01)
(52) U.S. Cl.
USPC .......................... 330/302; 330/124 R; 330/53
(58) Field of Classification Search
USPC ........................................ 330/302, 124 R, 53
IPC ........................................................ H03F 3/04
See application file for complete search history.

(56) References Cited

U.S. PATENT DOCUMENTS

| | | | | |
|---|---|---|---|---|
| 5,392,014 A | * | 2/1995 | Nishida et al. | 333/218 |
| 5,901,345 A | * | 5/1999 | Ikeda et al. | 455/114.3 |
| 6,046,641 A | * | 4/2000 | Chawla et al. | 330/277 |
| 6,316,983 B1 | * | 11/2001 | Kitamura | 327/317 |
| 6,737,922 B2 | * | 5/2004 | Pengelly et al. | 330/295 |
| 6,954,623 B2 | * | 10/2005 | Chang et al. | 455/127.1 |
| 7,847,630 B2 | * | 12/2010 | Okubo et al. | 330/124 R |
| 2008/0125061 A1 | * | 5/2008 | Kuriyama et al. | 455/127.1 |

FOREIGN PATENT DOCUMENTS

| | | |
|---|---|---|
| JP | 2001-356779 A | 12/2001 |
| JP | 2003-234626 A | 8/2003 |

OTHER PUBLICATIONS

A. Inoue, et al., "Analysis of class-F and inverse class-F amplifiers," IEEE MTT-S Int. Microwave Symp. Dig., Boston, MA Jun. 2000, pp. 775-778.

* cited by examiner

*Primary Examiner* — Patricia Nguyen
(74) *Attorney, Agent, or Firm* — Arent Fox LLP

(57) ABSTRACT

A power amplifier includes a first matching circuit configured to perform harmonic processing of an input signal, and a second matching circuit configured to perform the harmonic processing of an output signal, the output signal being generated by amplifying a power of the input signal. The power amplifier rotates a phase of output impedance at a matching point of the harmonic included in the generated output signal when the power of the input signal is decreased from a value higher than a certain value to a value lower than the certain value.

18 Claims, 11 Drawing Sheets

FIG. 8

| INPUT POWER VALUE | DRAIN CURRENT REFERENCE VALUE |
|---|---|
| p_0 | id_0 |
| p_1 | id_1 |
| ⋮ | ⋮ |
| p_n | id_n |
| ⋮ | ⋮ |

802 ized by, for example, Class F power amplifiers.
POWER AMPLIFIER

CROSS-REFERENCE TO RELATED APPLICATION

This application is based upon and claims the benefit of priority of the prior Japanese Patent Application No. 2011-255754, filed on Nov. 24, 2011, the entire contents of which are incorporated herein by reference.

FIELD

The embodiments discussed herein are related to power amplifiers.

BACKGROUND

Radio communication apparatuses used in radio base stations include power amplifiers in order to amplify the powers of transmission signals that are wirelessly transmitted. Since the power amplifiers are generally requested to perform high-output operations for radio-frequency input signals, the power amplifiers are desirable to have high power amplification efficiency for the radio-frequency input signals. The power amplifiers having the high amplification efficiency are realized by, for example, Class F power amplifiers.

FIG. 1 illustrates an example of the configuration of a power amplifier in related art. Referring to FIG. 1, a power amplifier 100 includes a transistor 102, an input matching circuit 104, an output matching circuit 106, a gate bias generating circuit 108, and a drain bias generating circuit 110.

A certain gate bias voltage is supplied from the gate bias generating circuit 108 to the gate of the transistor 102 through the input matching circuit 104, and a certain drain bias voltage is supplied from the drain bias generating circuit 110 to the drain of the transistor 102 through the output matching circuit 106. The transistor 102 receives an input signal supplied to an input node Pin of the power amplifier 100 at the gate thereof and amplifies the power of the received input signal. The transistor 102 supplies the signal resulting from the power amplification to an output node Pout of the power amplifier 100 from the drain thereof as an output signal.

The output matching circuit 106 is coupled to the drain of the transistor 102. The output matching circuit 106 functions as a harmonic processing circuit that processes a harmonic included in the output signal from the transistor 102. When the power amplifier 100 operates as a Class F amplifier, harmonic processing is performed so that the impedance when a load circuit side (the output matching circuit 106 side) of the transistor 102 is viewed from an output node thereof is equal to zero (is short-circuited) for even-order harmonics and is equal to infinity (is opened) for odd-order harmonics in the output matching circuit 106. When the power amplifier 100 operates as the Class F amplifier, such harmonic processing allows the overlap between the voltage waveform and the current waveform of the output signal to be reduced. As a result, it is possible to reduce the power loss to improve the efficiency of the power amplification. Methods of realizing the harmonic processing circuit by a distributed constant line composed of multiple stubs are disclosed in, for example, Japanese Laid-open Patent Publication No. 2001-356779 and Japanese Laid-open Patent Publication No. 2003-234626.

The input matching circuit 104 is coupled to the gate of the transistor 102. The input matching circuit 104 functions as a harmonic processing circuit that processes a harmonic included in the input signal into the transistor 102. Harmonic processing similar to the one performed in the output matching circuit 106 is performed also in the input matching circuit 104 in the power amplifier 100. In the power amplifier 100, performing the harmonic processing not only in the output matching circuit 106 at the output side but also in the input matching circuit 104 at the input side allows the efficiency of the power amplification to be further improved.

In addition, inverse Class F power amplifiers are also proposed, in which the harmonic processing is performed so that the impedance when the load circuit of the transistor 102 is viewed from the output node thereof is equal to infinity (is opened) for the even-order harmonics and is equal to zero (is short-circuited) for the odd-order harmonics in the in the output matching circuit 106 to reverse the relationship between the voltage waveform and the current waveform of the output signal with respect to the one in the Class F amplifiers in order to improve the efficiency of the power amplification. For example, "Analysis of class-F and inverse class-F amplifiers" (A. Inoue, et al, IEEE MTT-S Int. Microwave Symp. Dig., Boston, Mass. June 2000, pp. 775-778) is known as a related art concerning this proposition. It is considered that the reverse Class F power amplifiers are capable of achieving more efficient power amplification, compared with the Class F amplifiers.

SUMMARY

According to an aspect of the invention, a power amplifier includes a first matching circuit configured to perform harmonic processing of an input signal, and a second matching circuit configured to perform the harmonic processing of an output signal, the output signal being generated by amplifying a power of the input signal. The power amplifier rotates a phase of output impedance at a matching point of the harmonic included in the generated output signal when the power of the input signal is decreased from a value higher than a certain value to a value lower than the certain value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 illustrates an example of a reference value table;

DESCRIPTION OF EMBODIMENTS

Providing the stubs at both the input side (the gate side) of the transistor and the output side (the drain side) thereof to perform the harmonic processing at both the input side and the output side as in the related art allows the efficiency of the power amplification to be improved, compared with a case in which no stub is provided and the harmonic processing is performed neither at the input side nor at the output side and a case in which the stubs are provided only at the output side and the harmonic processing is performed only at the output side.

However, the inventor found by an experiment that oscillation could occur in a harmonic bandwidth when the stubs were provided at both the input side (the gate side) of the transistor and the output side (the drain side) thereof. Since such oscillation phenomenon can make the operation of the power amplifier unstable, is desirable to suppress an occurrence of the oscillation in advance.

Power amplifiers according to embodiments are capable of suppressing occurrence of the oscillation to enable stable operation even when matching circuits that perform the harmonic processing are provided at both the input sides of transistors and the output sides thereof.

The embodiments will herein be described with reference to the attached drawings,

1. First Embodiment

A power amplifier according to a first embodiment will be described.

1-1. Experiment and Consideration Concerning Oscillation Phenomenon

Before the power amplifier according to the first embodiment is described, experiments and considerations concerning the oscillation phenomenon described above performed by the inventor will now be described.

1-1-1. Experiment Concerning Oscillation Phenomenon

Figure 1:
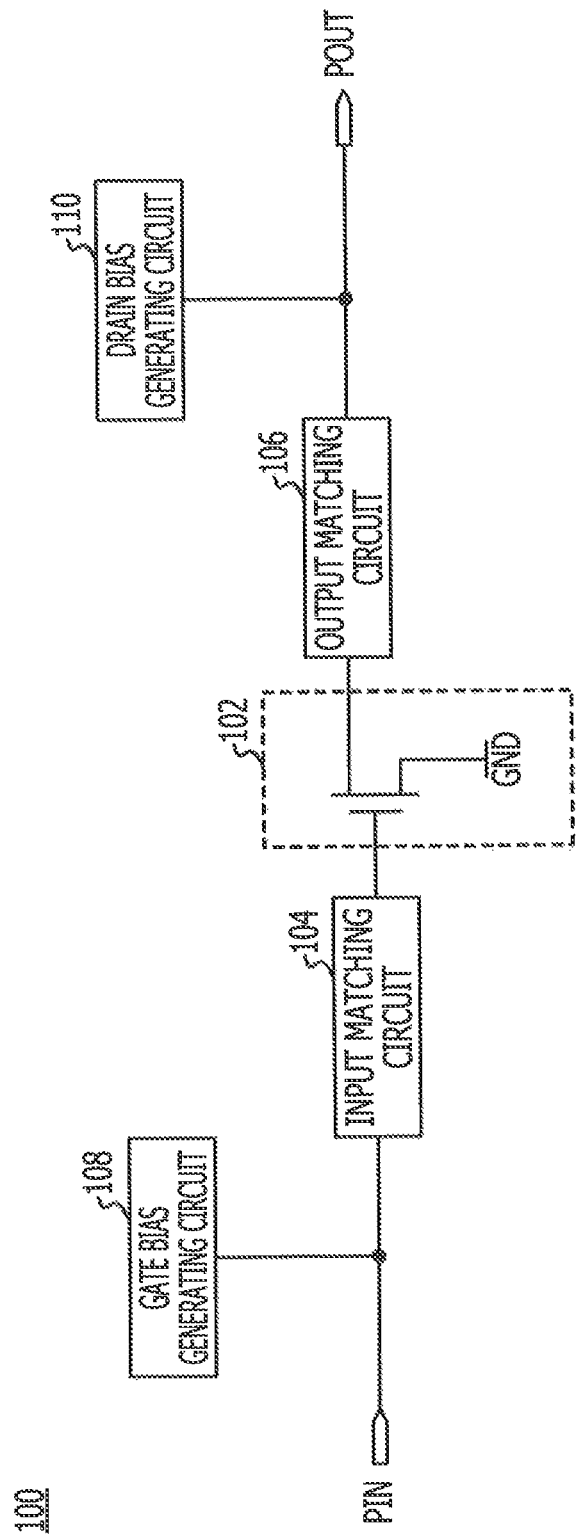
FIG. 1 illustrates an example of the configuration of a power amplifier in related art.
Figure 2:
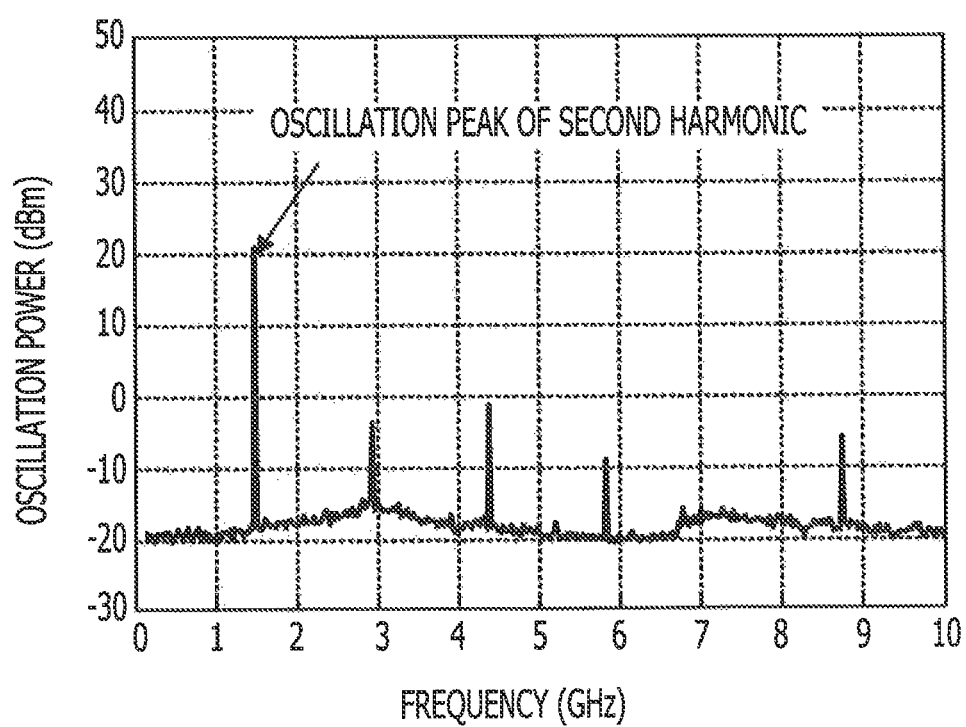
FIG. 2 illustrates an example of oscillation in a power amplifier in which stubs are provided at both the input side and the output side of a transistor to compose a harmonic processing circuit.

FIG. 2 is a graph illustrating an exemplary result of a first experiment concerning the oscillation phenomenon, performed by the inventor using the power amplifier 100 illustrated in FIG. 1, FIG. 2 illustrates an example of the oscillation in a Class F power amplifier in which stubs are provided at both the input side and the output side of the transistor 102 in FIG. 1 to compose a harmonic processing circuit.

The example of the oscillation illustrated in FIG. 2 was observed in the harmonic bandwidth in response to an input signal having a fundamental wave of 800 MHz and was based on data acquired by the inventor by the experiment. As apparent from FIG. 2, occurrences of the oscillation were observed in even-order harmonics.

According to the first experiment performed by the inventor, the oscillation illustrated in FIG. 2 was observed only when the power input into the power amplifier is decreased from a high power value belonging to an area (a saturation area) where the output power is saturated to a low power value belonging to an area (a linear area) where linear relationship is established between the input power and the output power in the transistor. The oscillation illustrated in FIG. 2 was not observed when the input power is set to a high power value belonging to the saturation area. The above oscillation was not observed also when the input power is increased from a low power value belonging to the linear area to a high power value belonging to the saturation area.

In other words, the inventor found from the result of the first experiment that the above oscillation was observed only when the input power into the power amplifier is decreased from a power value belonging to the saturation area of the transistor to a power value belonging to the linear area thereof and had a history (hysteresis) for the input power.

In contrast, the inventor confirmed by a second experiment that the oscillation illustrated in FIG. 2 did not occur when the stubs were separated at either of the input side and the output side of the transistor not to provide the harmonic processing circuit.

1-1-2. Consideration Based on Results of First Experiment and Second Experiment The result of the second experiment indicates that no oscillation occurred when the stubs were separated at either of the input side and the output side of the transistor. Accordingly, it is considered that the above oscillation phenomenon was caused by, for example, formation of a reflector composed of the stubs provided at both the input side and the output side of the transistor, an occurrence of reflection of signals between the stubs provided at the input side and the output side, and an occurrence of oscillation of the signals between the stubs provided at the input side and the output side.

Specifically, the harmonic of the output signal from the transistor 102 is reflected by the output matching circuit 106 provided at the output side of the transistor 102 and the reflected harmonic signal is returned to the input side of the transistor 102. The returned harmonic signal is reflected by the input matching circuit 104 provided at the input side of the transistor 102, the reflected harmonic signal is amplified by the transistor 102, and the amplified harmonic signal appears again at the output side of the transistor 102 as the output signal.

It is considered from the result of the first experiment that, when the input power into the power amplifier was decreased from a high power value belonging to the saturation area of the transistor to a low power value belonging to the linear area thereof, a resonance condition was met in the reflection of the signals between the stubs provided at the input side and the output side to cause the oscillation.

In particular, in the case of the power amplifier using the transistor, the gain is increased with the decreasing input power into the transistor. Accordingly, it is considered that, even when the input power into the transistor was low and the signal returned to the input side due to the reflection from the stubs at the output side of the transistor had low power, the power of the returned signal was amplified by the transistor and the output signal having high output power occurred at the output side to easily cause the oscillation.

Accordingly, it is considered that, in order to suppress the occurrence of the oscillation in the power amplifier, it is effective to intentionally cause the output signal (the harmonic signal) from the transistor not to meet the resonance condition of the signals between the stubs provided at the input side and the output side.

The result of the second experiment indicates that the separation of the stubs at either of the input side and the output side of the transistor suppressed the occurrence of the oscillation. However, when the stubs at either side are separated, it is difficult to achieve the high power amplification efficiency, unlike the case described above. Accordingly, it is not desirable to separate the stubs at either side.

1-1-3. Verification Experiment of Method of Suppressing Oscillation

The inventor further performed the following verification experiment on the basis of the above consideration.

The inventor performed a third experiment to verify whether the oscillation illustrated in FIG. 2 is observed in the harmonic bandwidth when a gate bias voltage is varied to increase the gate bias voltage to values −2.69 V, −2.39 V, and −2.19 V in a positive voltage direction.

In the third experiment, the power amplifier 100 illustrated in FIG. 1 was used, a negative-voltage Gallium Nitride (GaN) field effect transistor (FET) having an output power of 10 W and having a negative pinch-off voltage was used as the transistor 102, and a drain bias voltage was set to 28 V in the drain bias generating circuit 110. In addition, a configuration was adopted, in which distributed constant lines composed of multiple stubs are used as the input matching circuit 104 and the output matching circuit 106 and the harmonic processing is performed to a second harmonic at both the input side and the output side. A radio-frequency signal having a fundamental wave of 800 MHz was used as the input signal.

It was observed from the result of the third experiment that, when the gate bias voltage was set to −2.69 V, the oscillation phenomenon illustrated in FIG. 2 was observed when the input power was decreased from a power value belonging to the saturation area to a power value belonging to the linear area. It was also observed from the result of the third experiment that, when the gate bias voltage was set to −2.39 V, the oscillation phenomenon illustrated in FIG. 2 was observed but the power value (peak value) of the harmonic (for example, the second harmonic) where the oscillation was observed was lower than that when the gate bias voltage was set to −2.69 V. It was further confirmed from the result of the third experiment that, when the gate bias voltage was set to −2.19 V, no oscillation phenomenon was observed even when the input power was decreased from a power value belonging to the saturation area to a power value belonging to the linear area and the peak of the power observed in, for example, the second harmonic disappeared.

1-1-4. Consideration of Result of VERIFICATION EXPERIMENT

Figure 11:
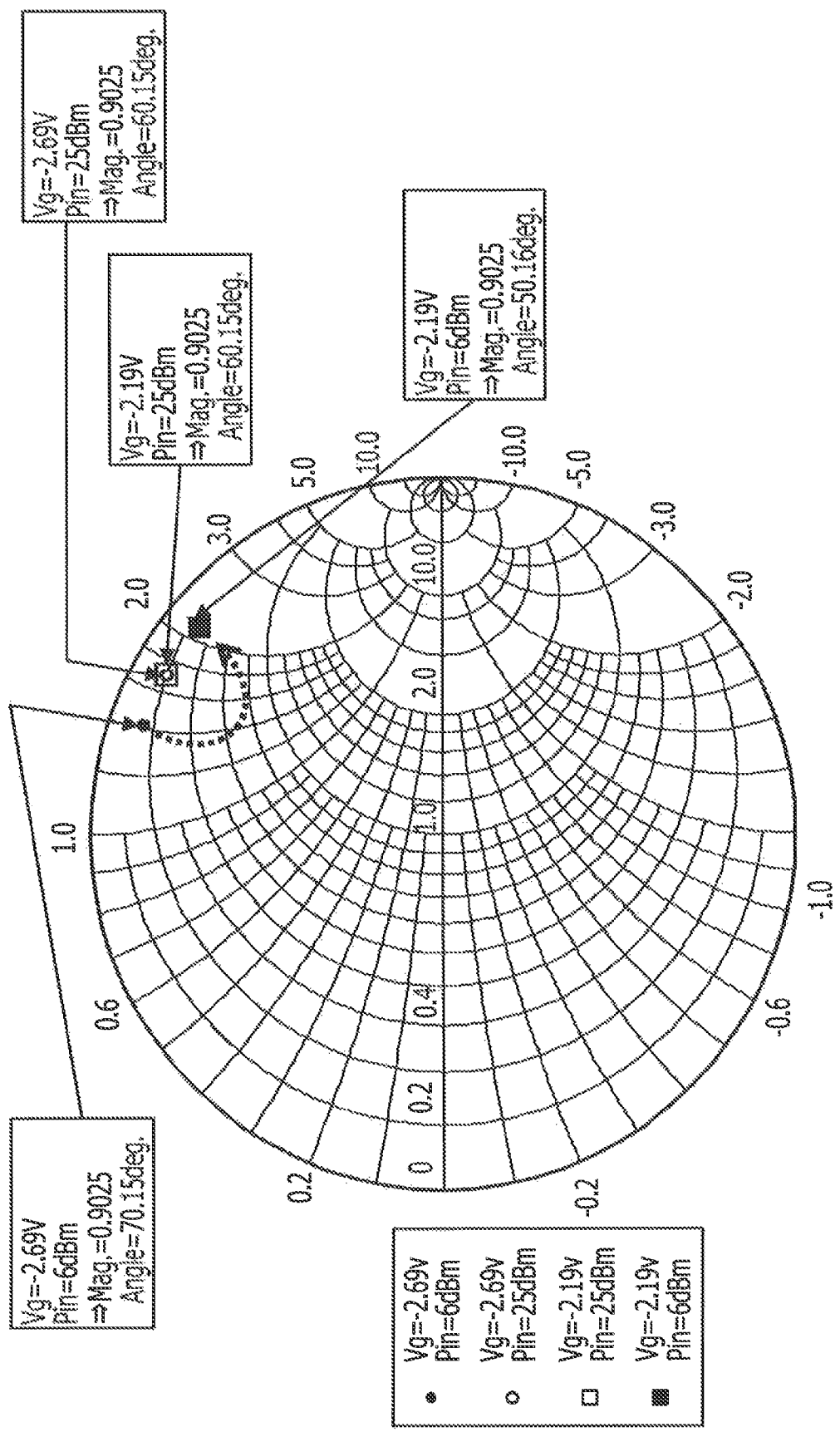
FIG. 11 illustrates an exemplary result of simulation of an optimal matching point for a second harmonic when a gate bias voltage is varied.

The inventor took the following consideration concerning the fact that the increase of the gate bias voltage in the positive voltage direction caused the oscillation not to occur, as indicated by the result of the third experiment, FIG. 11 illustrates an exemplary result of simulation performed by the inventor by using a Smith chart. The result of the simulation of an optimal matching point for the second harmonic when the gate bias voltage was varied is illustrated in FIG. 11. The simulation in FIG. 11 was performed by using the power amplifier 100 illustrated in FIG. 1, as in the third experiment described above.

FIG. 11 indicates that, when the input power had a value belonging to the saturation area where no oscillation is observed (Pin=25 dBm), the matching point for the second harmonic was not varied even when the gate bias voltage was increased from −2.69 V to −2.19 V.

In contrast, FIG. 11 indicates that, when the input power had a value belonging to the linear area where the oscillation is observed (Pin=6 dBm), the matching point for the second harmonic was shifted in a manner illustrated by a dotted-line arrow in FIG. 11 and the phase of the impedance for the second harmonic signal was rotated from about 70 degrees to about 50 degrees when the gate bias voltage was increased from −2.69 V to −2.19 V.

In other words, the inventor confirmed that, in the power amplifier 100, the increase of the gate bias voltage in the positive voltage direction when the input power had a low value belonging to the linear area allowed the matching point for the harmonic signal to be shifted to rotate the phase of the output impedance at the matching point for the harmonic signal to a direction in which the phase is decreased.

It is considered that, since the shift of the matching point for the harmonic signal caused the gain of the transistor 102 when the input power had a low value belonging to the linear area to be decreased, the harmonic signal did not meet the resonance condition of the signal between the input matching circuit 104 and the output matching circuit 106 to suppress the oscillation.

From another viewpoint, it is considered that, when the gate bias voltage was decreased in a negative voltage direction in the power amplifier 100, a bandwidth having a stability index (K factor) of a value lower than one existed in the harmonic bandwidth and the matching point for the harmonic signal could be positioned in the unstable area. This is because it is known that the oscillation can occur in the unstable area in which the stability index of the power amplifier has a value lower than one.

In contrast, since the stability index in the entire harmonic bandwidth can be increased when the gate bias voltage is increased in the positive voltage direction, the stability index can be set to a value higher than one even in the bandwidth where the stability index has a value lower than one.

Accordingly, it is considered that, since the matching point for the harmonic signal could be shifted from the unstable area to the stable area in which the stability index has a value higher than one and there is no possibility of the occurrence of the oscillation, the harmonic signal did not meet the resonance condition of the signal between the input matching circuit 104 and the output matching circuit 106 to suppress the oscillation.

1-1-5. Experiment Concerning Input-Output Characteristics of Power Amplifier The inventor performed a fourth experiment to verify how input-output characteristics of the power amplifier are varied when the gate bias voltage is increased to the values −2.69 V, −2.39 V, and −2.19 V in the positive voltage direction in consideration of the result of the experiment in which no oscillation phenomenon was observed when the gate bias voltage was set to a value of −2.19 V. A power amplifier having the same configuration as that in the third experiment was used in the fourth experiment.

Figure 3:
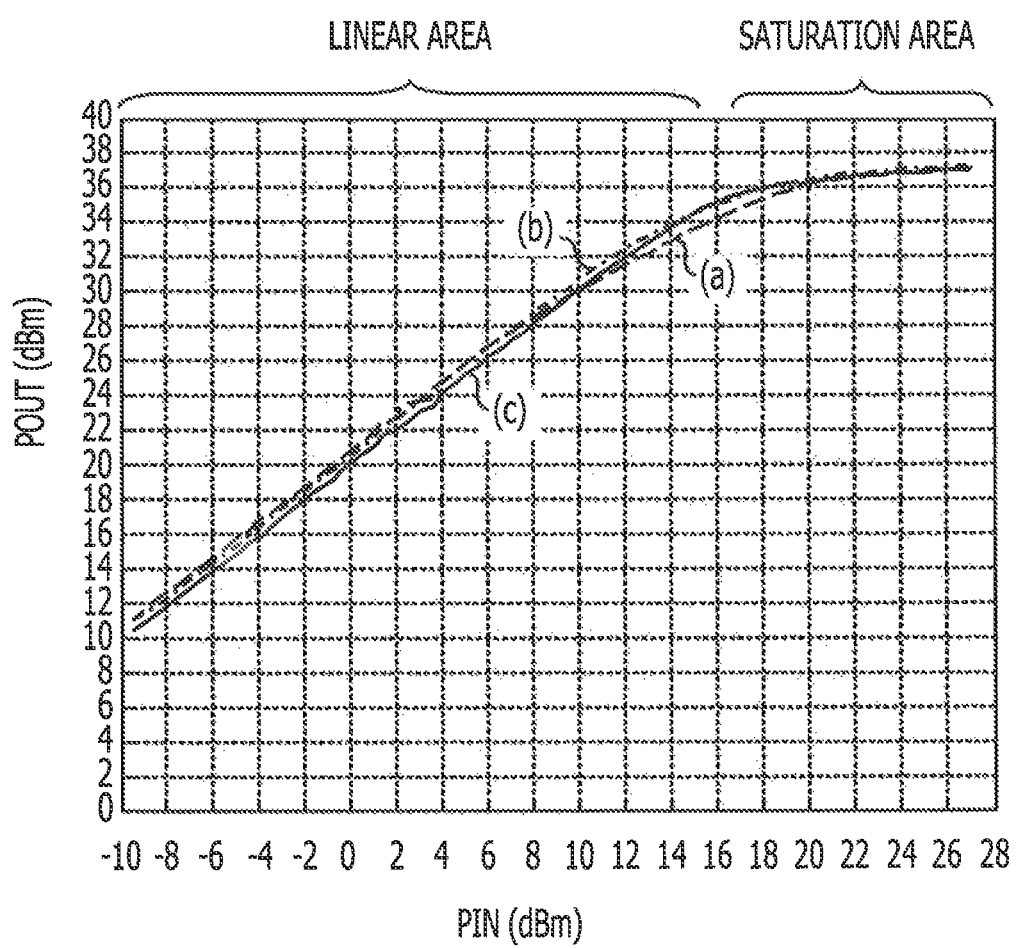
FIG. 3 depicts input-output characteristics of a power amplifier.

FIG. 3 illustrates the result of the fourth experiment and depicts the input-output characteristics of the power amplifier. FIG. 3 illustrates the correlation between the power of the input signal supplied to the gate of the transistor 102 (the input power) and the power of the output signal output from the drain thereof (the output power), Referring to FIG. 3, a curved line (a) represented by a broken line illustrates the input-output characteristic when the gate bias voltage was set to a value of −2.69 V, a curved line (b) represented by an alternate long and short dash line illustrates the input-output characteristic when the gate bias voltage was set to a value of −2.39 V, and a curved line (c) represented by a solid line illustrates the input-output characteristic when the gate bias voltage was set to a value of −2.19 V.

Referring to each of the curved lines (a) to (c) illustrated in FIG. 3, the input-output characteristic of the power amplifier 100 has the linear area toward the lower input power and the saturation area toward the higher input power. The relationship between the output power and the input power has linearity in the linear area, and the output power is saturated and is kept at a substantially fixed value with the increasing input power in the saturation area.

Comparison between the curved lines (a) to (c) illustrated in FIG. 3 indicates that the difference between the input-output characteristics at the respective gate bias voltages was relatively small and was within an allowable range from the viewpoint of the amplification efficiency in the power amplifier 100. In particular, the drain efficiencies in the saturation area were 74.8%, 74.7%, and 74.7% at the gate bias voltages of −2.69 V, −2.39 V, and −2.19 V, respectively, and the difference between the drain efficiencies was small. It was confirmed that, even when the gate bias voltage was increased from −2.69 V to −2.19 V in the positive voltage direction, the effect of the variation in the input-output characteristics on the amplification efficiency was within an allowable range.

However, when the gate bias voltage is increased from −2.69 V to −2.19 V in the positive voltage direction, the average level of the voltage applied to the gate during the operation period of the transistor 102 is increased and, thus, the average value of the drain current flowing through the transistor 102 during the operation period of the transistor 102 is also increased. Since the increase in the drain current flowing through the transistor 102 during the operation period of the transistor 102 can accelerate the deterioration of the transistor 102 to decrease the life of the transistor, thereby causing a reduction in the reliability of the device.

Accordingly, it is not desirable to increase the gate bias voltage from the viewpoint of the reliability of the transistor.

1-2. Method of Suppressing Oscillation

The inventor focused on the following points (a) to (d) on the basis of the experiments and the considerations described above.

(a) The oscillation phenomenon was observed in the harmonic bandwidth when the input power was decreased from a power value belonging to the saturation area to a power value belonging to the linear area.

(b) The oscillation phenomenon was not observed in the harmonic bandwidth when the gate bias voltage was increased in the positive voltage direction.

(c) The effect of the variation in the input-output characteristics of the power amplifier on the amplification efficiency could be suppressed within an allowable range even when the gate bias voltage was increased in the positive voltage direction.

(d) It is desirable not to increase the gate bias voltage in order not to reduce the reliability of the transistor.

The inventor found the following method of suppressing the oscillation on the basis of the above points (a) to (d), In the method of suppressing the oscillation, the variation in the input power is monitored in the power amplifier, it is determined that the oscillation can occur if the input power is lower than a predetermined threshold value, and the gate bias voltage is set to a first voltage value at which the oscillation can be suppressed. It is determined that no oscillation can occur if the input power is higher than the predetermined threshold value and the gate bias voltage is decreased in the negative voltage direction and is set to a second voltage value lower than the first voltage value.

In the above method, it is determined that the oscillation can occur when the input power is lower than the above threshold value and the gate bias voltage is set to the first voltage value at which the oscillation can be suppressed because of the above points (a), (b), and (c). It is determined that no oscillation can occur when the input power is higher than the above threshold value and the gate bias voltage is set to the second voltage value lower than the first voltage value in the negative voltage direction because of the above points (a) and (d).

Since the oscillation phenomenon is observed when the input power is decreased from a power value belonging to the saturation area to a power value belonging to the linear area, the above threshold value is set to a value that is within the range of the values of the input power belonging to the linear area and that is higher than the value of the input power at which the oscillation is started to be observed with the decreasing input power. The above threshold value is set to, for example, 10 dBm in the input-output characteristics of the power amplifier illustrated in FIG. 3.

The first voltage value is set to a value at which no oscillation occurs in the power amplifier when the input power is decreased from a power value belonging to the saturation area to a power value belonging to the linear area. The second voltage value is set to, for example, −2.19 V in the input-output characteristics of the power amplifier illustrated in FIG. 3.

The second voltage value may be set to a value at which the oscillation can occur in the power amplifier when the input power is decreased from a power value belonging to the saturation area to a power value belonging to the linear area. The first voltage value is set to, for example, −2.69 V in the input-output characteristics of the power amplifier illustrated in FIG. 3.

From the viewpoint of the function and the operation of the transistor on the basis of the consideration of the result of the verification experiment described above, setting the gate bias voltage to the first voltage value in the above method when the input power is decreased from a power value belonging to the saturation area of the transistor to a power value belonging to the linear area thereof corresponds to the transistor that rotates the phase of the output impedance at the matching point for the harmonic signal that is output to a direction in which the phase is decreased to shift the gain of the transistor in a direction in which the gain is decreased. Alternatively, from another viewpoint, the above setting corresponds to the transistor that sets the stability index (K factor) of the power amplifier in the harmonic bandwidth to a value higher than one so that the matching point for the harmonic signal is positioned in the stable area.

1-3. Configuration of Power Amplifier

An example of the configuration of a power amplifier 400 according to the first embodiment will now be described. The power amplifier 400 according to the first embodiment has a function and a configuration to realize the method of suppressing the oscillation described above and performs an operation to realize the method of suppressing the oscillation, 1-3-1. Example of Configuration of Power Amplifier 400

Figure 4:
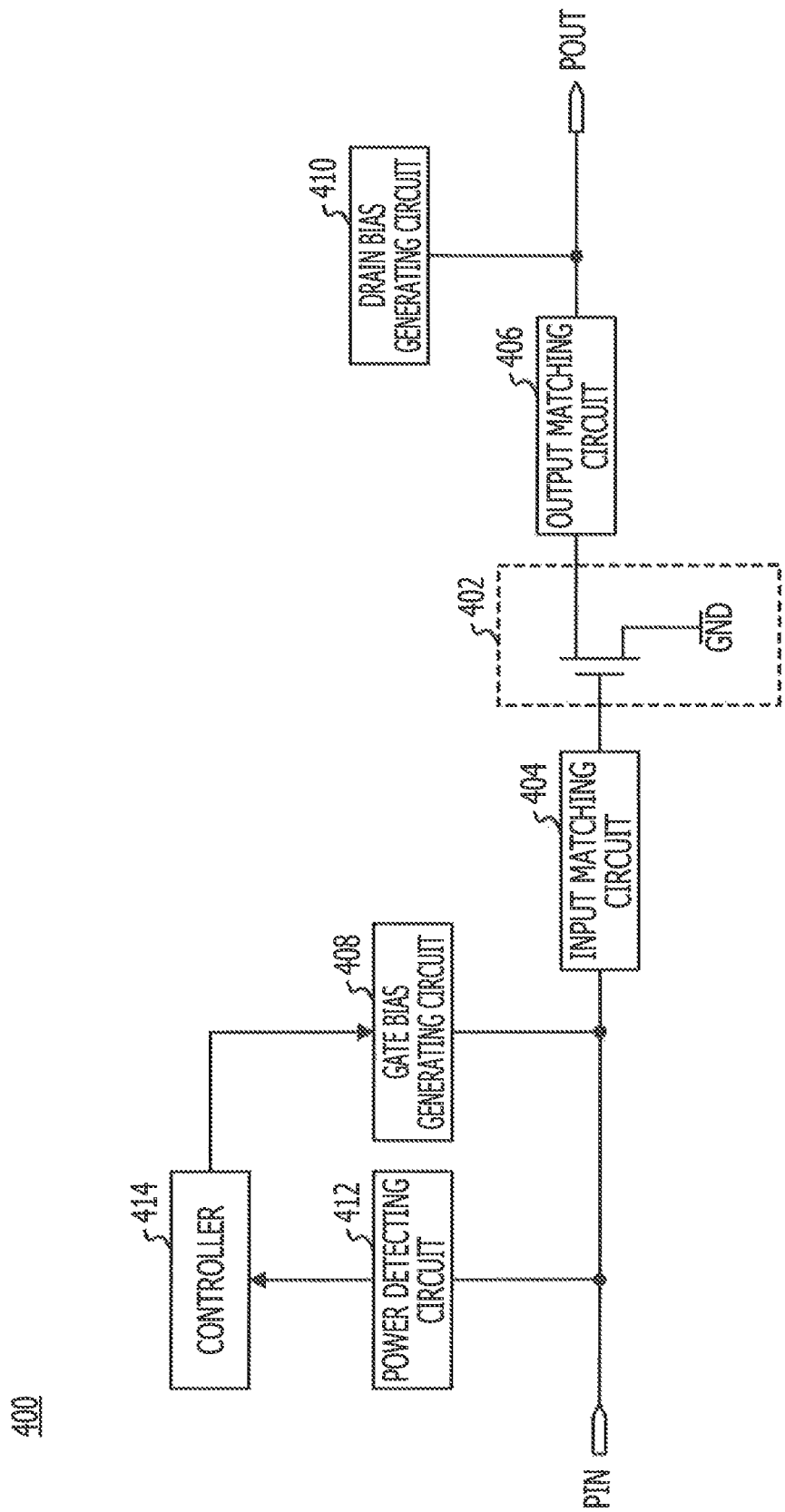
FIG. 4 illustrates an example of the configuration of a power amplifier according to a first embodiment.

FIG. 4 illustrates an example of the configuration of the power amplifier 400 according to the first embodiment. The power amplifier 400 illustrated in FIG. 4 is, for example, a Class F amplifier. Referring to FIG. 4, the power amplifier 400 includes a transistor 402, an input matching circuit 404, an output matching circuit 406, a gate bias generating circuit 408, a drain bias generating circuit 410, a power detecting circuit 412, and a controller 414.

The transistor 402 is electrically coupled to ground (GND) at its source and functions as a power amplification circuit. Specifically, the transistor 402 receives an input signal supplied to an input node Pin of the power amplifier 400 via the input matching circuit 404 at its gate and amplifies the power of the received input signal. The transistor 402 supplies the amplified signal from its drain to an output node Pout of the power amplifier 400 via the output matching circuit 406.

The transistor 402 is, for example, a field effect transistor (FET). For example, a GaN FET having an output power of 10 W and having a negative pinch-off voltage is used as the transistor 402. However, a bipolar transistor may be used as the transistor 402, Alternatively, another amplification circuit may be used, instead of the transistor 402.

The input signal supplied to the gate of the transistor 402 through the input node Pin is, for example, a radio-frequency signal having a frequency within a range of several hundred megahertz to several gigahertz and includes multiple harmonic signals having frequencies that are integer multiples of the frequency of a fundamental signal (fundamental frequency), in addition to the fundamental signal.

The input matching circuit 404 is provided at the input side of the transistor 402 and is electrically coupled to the gate of the transistor 402. The input matching circuit 404 performs the harmonic processing of the harmonic signals included in the input signal. The input matching circuit 404 will be described in detail below.

The output matching circuit 406 is provided at the output side of the transistor 402 and is electrically coupled to the drain of the transistor 402. The output matching circuit 406 performs the harmonic processing of the harmonic signals included in the output signal. The output matching circuit 406 will be described in detail below.

The drain bias generating circuit 410 is electrically coupled to the output matching circuit 406 and supplies a bias voltage (drain bias voltage) to the drain of the transistor 402 via the output matching circuit 406, A bias voltage of, for example, 28 V is supplied from the drain bias generating circuit 410. The drain bias generating circuit 410 is capable of being realized by a known voltage generating circuit.

The gate bias generating circuit 408 is electrically coupled to the input matching circuit 404 and supplies a bias voltage (gate bias voltage) to the gate of the transistor 402 via the input matching circuit 404, The operation of the gate bias generating circuit 408 is controlled by the controller 414. The gate bias generating circuit 408 varies the value of the gate bias voltage to be supplied to the gate of the transistor 402 on the basis of voltage setting information supplied from the controller 414. The gate bias generating circuit 408 is capable of being realized by a known variable voltage generating circuit.

The power detecting circuit 412 is electrically coupled to the input node Pin of the power amplifier 400 and continuously detects the average power (average input power) of the input signal supplied to the input node Pin. The power detecting circuit 412 appropriately supplies the value of the detected average power of the input signal to the controller 414. The power detecting circuit 412 is, for example, a known power sensor.

The controller 414 receives the value of the average power of the input signal from the power detecting circuit 412 and controls the output operation of the gate bias voltage, performed by the gate bias generating circuit 408, on the basis of the received value of the average power of the input signal, Since the oscillation phenomenon is observed when the input power is decreased from a power value belonging to the saturation area of the transistor to a power value belonging to the linear area thereof and the interval between the occurrence of the oscillation and the disappearance thereof is relatively long, as described above, the oscillation phenomenon is sufficiently controlled by the detection of the average power.

The controller 414 is capable of being realized by, for example, a computer in which a program realizing an output control function of the gate bias voltage is installed. Alternatively, the controller 414 is capable of being realized by, for example, a processor that executes the program realizing the output control function of the gate bias voltage. Alternatively, the controller 414 is also capable of being realized by various large scale integrations (LSIs), such as an application specific integrated circuit (ASIC), a digital signal processor (DSP), and a field programmable gate array (FPGA), having the output control function of the gate bias voltage.

The controller 414 determines the setting value of the gate bias voltage to be output from the gate bias generating circuit 408 on the basis of the received value of the average power of the input signal. The controller 414 generates the voltage setting information indicating the determined setting value of the gate bias voltage and supplies the voltage setting information to the gate bias generating circuit 408.

The controller 414 sets the setting value of the gate bias voltage to a first voltage value if the received value of the average power of the input signal is lower than a first threshold value. The first threshold value is set to a value within the range of the values of the input power belonging to the linear area and is higher than the value of the input power at which the oscillation is started to be observed when the input power is decreased from a power value belonging to the saturation area to a power value belonging to the linear area. For example, the first threshold value is set to 10 dBm in the input-output characteristics of the power amplifier illustrated in FIG. 3.

The first voltage value is the value of the gate bias voltage at which no oscillation occurs in the power amplifier when the input power is decreased from a power value belonging to the saturation area to a power value belonging to the linear area and is set to, for example, −2.19 V. This is because the oscillation can occur depending on the value of the gate bias voltage when the value of the input power is lower than the first threshold value. The first voltage value is higher than a second voltage value described below in the positive voltage direction.

The first threshold value and the first voltage value are determined by acquiring basic characteristics of the power amplifier in advance by an operation test that is performed in the power amplifier 400 before the product shipment. The first threshold value is determined by acquiring in advance, for example, the value of the input power which belongs to the linear area and at which the oscillation is started to be observed when the input power is decreased from a power value belonging to the saturation area through the operation test. The first voltage value is determined by acquiring in advance, for example, a characteristic such as the value of the gate bias voltage at which the oscillation can be suppressed through the operation test. The first threshold value and the first voltage value are stored in a memory in the controller 414.

The controller 414 sets the setting value of the gate bias voltage to the second voltage value if the received value of the average power of the input signal is higher than a second threshold value. The second threshold value is set to a value within the range of the values of the input power belonging to the linear area and is higher than the value of the input power at which the oscillation is started to be observed when the input power is decreased from a power value belonging to the saturation area to a power value belonging to the linear area. For example, the second threshold value is set to 10 dBm in the input-output characteristics of the power amplifier illustrated in FIG. 3.

The second voltage value is appropriately set from the viewpoint of optimization of the amplification efficiency of the power amplifier 400 and is set to, for example, −2.69 V. The second voltage value is desirably set to a lower value in the negative voltage direction as much as possible, which is within an allowable range from the viewpoint of the amplification efficiency, Since the second voltage value is used when the input power is higher than the second threshold value, the second voltage value may be set to a value at which the oscillation can occur in the power amplifier 400 when the input power is decreased from a power value belonging to the saturation area to a power value belonging to the linear area. The second threshold value and the second voltage value are stored in the memory in the controller 414.

Although the first threshold value is equal to the second threshold value in the above example, the first threshold value and the second threshold value are not limited to the above setting. The first threshold value may be different from the second threshold value.

Although the gate bias voltage output from the gate bias generating circuit is switched between the two setting values: the first setting value and the second setting value on the basis of the first threshold value and the second threshold value, respectively, in the above example, this setting is not limitedly used. For example, one or more setting values may be added between the first setting value and the second setting value and the gate bias voltage may be varied stepwise near the first threshold value and the second threshold value. Alternatively, the gate bias voltage may be continuously varied between the two setting values: the first setting value and the second setting value near the first threshold value and the second threshold value.

As described above, the gate bias voltage is set to the first voltage value described above in the power amplifier 400 even when the input power is decreased from a power value belonging to the saturation area of the transistor 402 to a power value belonging to the linear area thereof. Accordingly, rotating the phase of the impedance at the matching point for the harmonic signal that is output in the direction in which the phase is decreased to vary the gain of the transistor in the direction in which the gain is decreased causes the harmonic signal not to meet the resonance condition of the signal between the input matching circuit 404 and the output matching circuit 406. As a result, it is possible to suppress an occurrence of the oscillation to inhibit the operation of the power amplifier 400 from being unstable due to the oscillation.

In addition, since the gate bias voltage is set to the second voltage value lower than the first voltage value when the input power is increased to a power value belonging to the saturation area, it is possible to decrease the drain current flowing through the transistor 402. As a result, it is possible to decrease the average value of the drain current flowing through the transistor 402 during the operation period of the transistor 402 to inhibit the reduction in the reliability of the transistor 402.

1-3-2. Configuration of Input Matching Circuit 404 and Output Matching Circuit 406

Figure 5:
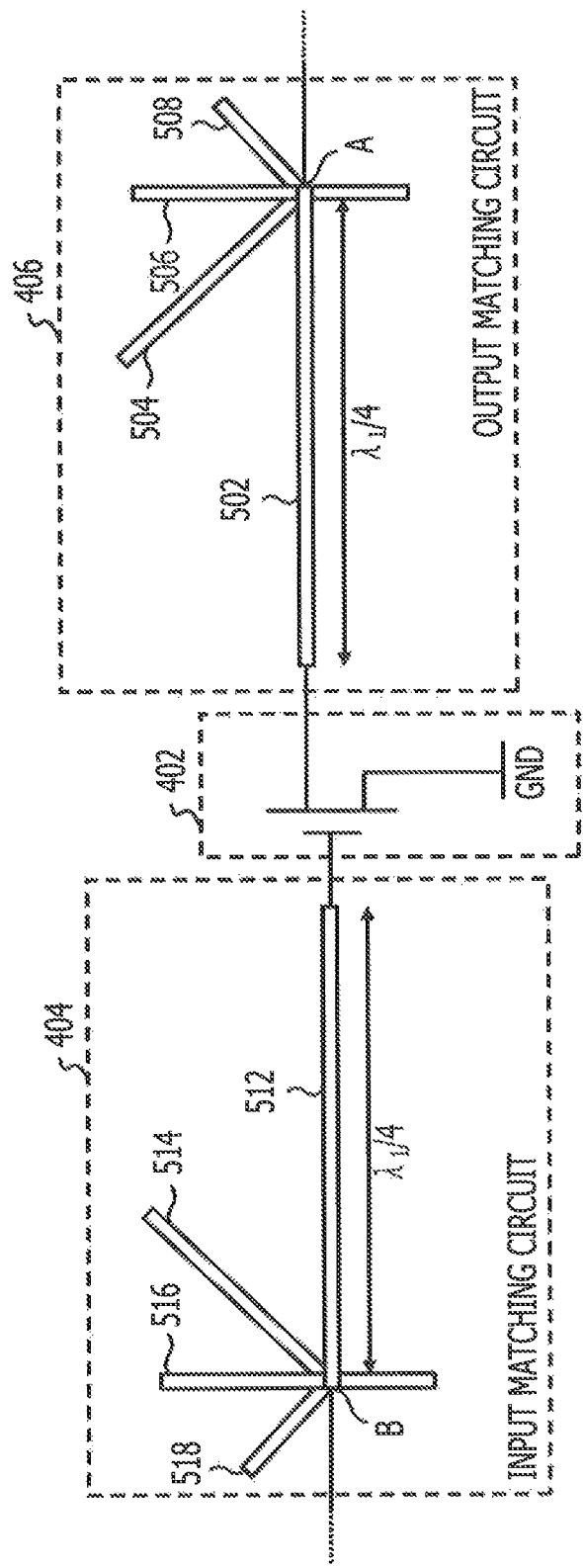
FIG. 5 illustrates an example of the configuration of an input matching circuit and an output matching circuit.

FIG. 5 illustrates an example of the configuration of the input matching circuit 404 and the output matching circuit 406. In the configuration of the input matching circuit 404 and the output matching circuit 406 illustrated in FIG. 5, the power amplifier 400 operates as a Class F amplifier.

Referring to FIG. 5, the output matching circuit 406 is a distributed constant line including a transmission line 502 and stubs 504, 506, 508, and 510. The transmission line 502 is coupled to the output node (the drain) of the transistor 402 and has a length of $\lambda 1/4$. $\lambda 1$ denotes the wavelength of the fundamental signal. The length of the transmission line 502 is determined so that the length with respect to the drain of the transistor 402 is equal to $\lambda 1/4$.

The stub 504 is an open stub. One end of the stub 504 is coupled to an end A of the transmission line 502, opposite to the drain of the transistor 402, and the other end thereof is opened. The stub 504 has a length of $\lambda 2/4$, that is, a length of $\lambda 1/8$. $\lambda 2$ denotes the wavelength of a second harmonic signal and corresponds to half the length of $\lambda 1$.

Similarly, the stubs 506, 508, and 510 are open stubs. One end of each of the stubs 506, 508, and 510 is coupled to the end A of the transmission line 502 and the other end thereof is opened. The stubs 506, 508, and 510 have lengths of $\lambda 3/4$, $\lambda 4/4$, and $\lambda 5/4$, that is, $\lambda 1/12$, $\lambda 1/16$, and $\lambda 1/20$, respectively. $\lambda 3$, $\lambda 4$, and $\lambda 5$ denote the wavelengths of a third harmonic signal, a fourth harmonic signal, and a fifth harmonic signal, respectively, and correspond to one third, one fourth, and one fifth of the length of $\lambda 1$.

The output matching circuit 406 is capable of being realized by processing, for example, a print circuited board having a permittivity of 3.1 and a dielectric tangent of 0.001 into a microstrip structure. However, the structure of the output matching circuit 406 is not limited to the microstrip structure and may have, for example, a triplate structure.

Since the stub 504 is an open stub in the output matching circuit 406, the impedance for the second harmonic signal is equal to zero (short-circuited) at the end A (the connection point A). Similarly, the stubs 506, 508, and 510 are open stubs, the impedances for the third harmonic signal, the fourth harmonic signal, and the fifth harmonic signal are equal to zero (short-circuited) at the end A (the connection point A).

In contrast, viewed from the drain of the transistor 402, the impedances of the transmission line 502 for the fundamental signal, the third harmonic signal, and the fifth harmonic signal are equal to infinity (is opened) while the impedances of the transmission line 502 for the second harmonic signal and the fourth harmonic signal are equal to zero (short-circuited) because the length of the transmission line 502 is equal to $\lambda 1/4$.

Accordingly, when the load circuit side (the output matching circuit 406 side) is viewed from the output node (the drain) of the transistor 402, the output matching circuit 406 can make the impedances for the second harmonic and the fourth harmonic zero (short-circuited) and can make the impedances for the third harmonic and the fifth harmonic infinite (opened). In other words, the output matching circuit 406 performs the harmonic processing to the fifth harmonic.

The input matching circuit 404 is a distributed constant line including a transmission line 512 and stubs 514, 516, 518, and 520. The transmission line 512 is coupled to the input node (the gate) of the transistor 402 and has a length of $\lambda 1/4$.

The stub 514 is an open stub having a length of $\lambda 2/4$. One end of the stub 514 is coupled to an end B of the transmission line 512, opposite to the gate of the transistor 402, and the other end thereof is opened. Similarly, the stubs 516, 518, and 520 are open stubs having lengths of λ3/4, λ4/4, and λ5/4, respectively. One end of each of the stubs 516, 518, and 520 is coupled to the end B of the transmission line 512, opposite to the gate of the transistor 402, and the other end thereof is opened.

The input matching circuit 404 is capable of being realized by processing, for example, a print circuited board having a permittivity of 3.1 and a dielectric tangent of 0.001 into a microstrip structure, as in the output matching circuit 406, When the load circuit side (the input matching circuit 404 side) is viewed from the input node (the gate) of the transistor 402, the input matching circuit 404 can make the impedances for the second harmonic and the fourth harmonic zero (short-circuited) and can make the impedances for the third harmonic and the fifth harmonic infinite (opened), as in the output matching circuit 406. In other words, the input matching circuit 404 performs the harmonic processing to the fifth harmonic.

Although the harmonic processing is performed to the fifth harmonic by the input matching circuit 404 and the output matching circuit 406 in the above example, this structure is not limitedly used. The number of orders of the harmonic to be subjected to the harmonic processing may be appropriately selected depending on, for example, the performance of the power amplifier 400.

Although the power amplifier 400 operating as an Class F amplifier is exemplified above, the power amplifier 400 may be caused to operate as an inverse Class F amplifier by designing the input matching circuit 404 and the output matching circuit 406 so that, when the load circuit is viewed from the input node and the output node of the transistor 402, the impedances for the even-order harmonics are made infinite (opened) and the impedances for the odd-order harmonics are made zero (short-circuited).

2. Second Embodiment

A power amplifier according to a second embodiment will now be described.

Figure 6:
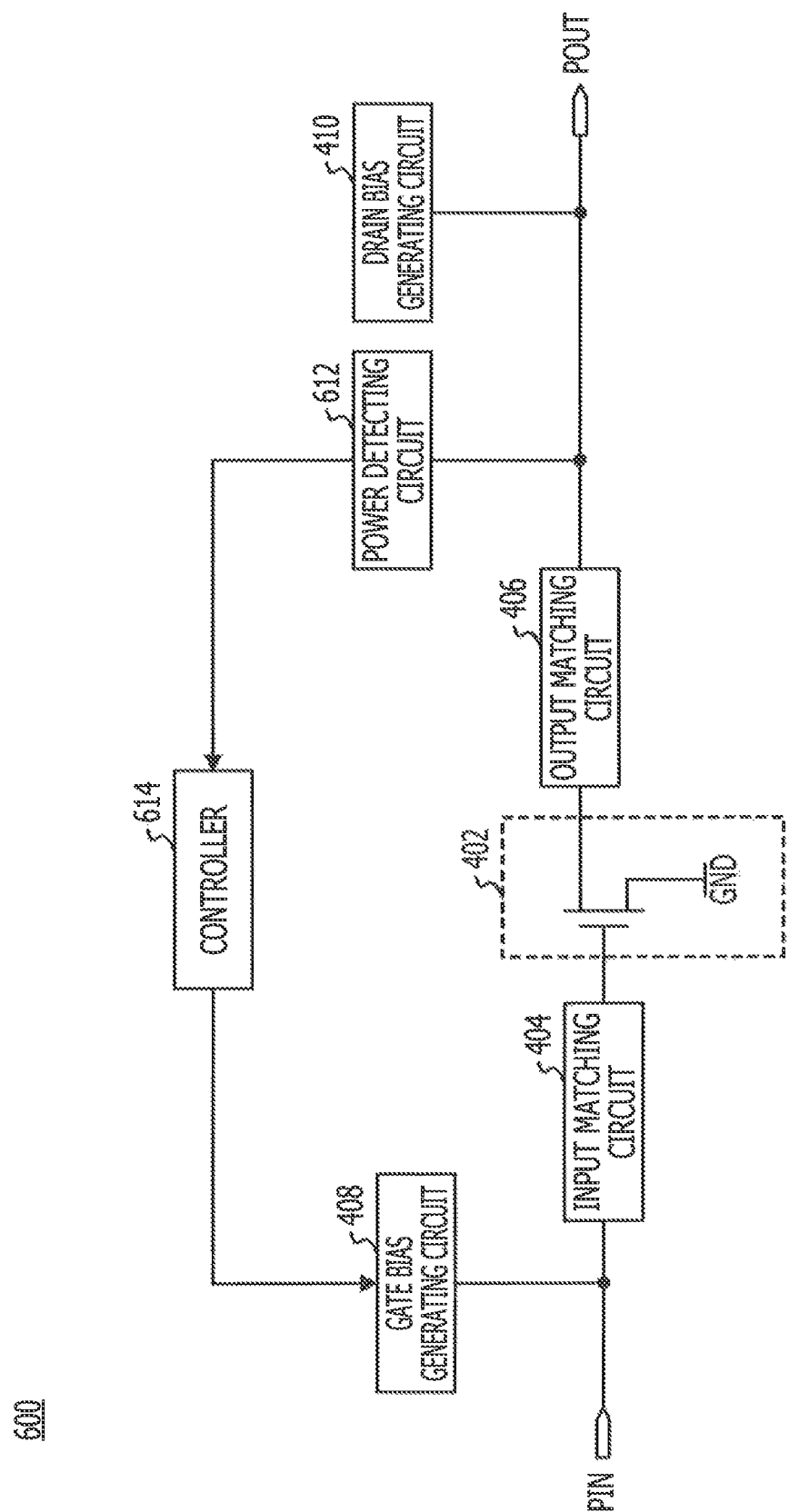
FIG. 6 illustrates an example of the configuration of a power amplifier according to a second embodiment.

FIG. 6 illustrates an example of the configuration of a power amplifier 600 according to the second embodiment. Although the power amplifier 600 illustrated in FIG. 6 differs from the power amplifier 400 illustrated in FIG. 4 in that a power detecting circuit 612 and a controller 614 are provided, instead of the power detecting circuit 412 and the controller 414, the configuration of the power amplifier 600 is otherwise the same as that of the power amplifier 400. The same reference numerals are used in the power amplifier 600 in FIG. 6 to identify the same or similar components in the power amplifier 400 illustrated in FIG. 4. The operations and functions of the components denoted by the same reference numerals in FIG. 6 are the same as those described above with reference to FIG. 4. A detailed description of the operations and functions of such components is omitted herein.

Although the power of the input signal supplied to the input node Pin (the input power) is detected with the power detecting circuit 412 in the power amplifier 400 illustrated in FIG. 4, the power of the output signal supplied to the output node Pout (the output power) is detected with the power detecting circuit 612 in the power amplifier 600 illustrated in FIG. 6. As apparent from the input-output characteristics of the power amplifier illustrated in FIG. 3, the output power is simply increased with the increasing input power and one-to-one relationship is established between the input power and the output power. Accordingly, the output power may be detected, instead of the detection of the input power, in order to monitor the variation in the input power.

Referring to FIG. 6, in the power amplifier 600, the power detecting circuit 612 is electrically coupled to the output node Pout of the power amplifier 600 and continuously detects the average power (average output power) of the output signal supplied to the output node Pout. The power detecting circuit 612 appropriately supplies the value of the detected average power of the output signal to the controller 614. The power detecting circuit 612 is, for example, a known power sensor.

The controller 614 receives the value of the average power of the output signal from the power detecting circuit 612 and controls the output operation of the gate bias voltage, performed by the gate bias generating circuit 408, on the basis of the received value of the average power of the output signal. Since the interval between the occurrence of the oscillation and the disappearance thereof is relatively long, as in the power amplifier 400, the oscillation phenomenon is sufficiently controlled by the detection of the average power.

The controller 614 determines the setting value of the gate bias voltage to be output from the gate bias generating circuit 408 on the basis of the received value of the average power of the output signal. The controller 614 generates voltage setting information indicating the determined setting value of the gate bias voltage and supplies the voltage setting information to the gate bias generating circuit 408. The controller 614 is realized by the same devices as in the controller 414.

The controller 614 sets the setting value of the gate bias voltage to a first voltage value if the received value of the average power of the output signal is lower than a first threshold value. The first threshold value is set to a value within the range of the values of the output power belonging to the linear area and is higher than the value of the output power at which the oscillation is started to be observed when the input power is decreased from a power value belonging to the saturation area to a power value belonging to the linear area. For example, the first threshold value is set to 30 dBm in the input-output characteristics of the power amplifier illustrated in FIG. 3, The first voltage value is higher than a second voltage value described below in the positive voltage direction. The first voltage value is similar to the one described above for the controller 414.

The controller 614 sets the setting value of the gate bias voltage to the second voltage value if the received value of the average power of the output signal is higher than a second threshold value. The second threshold value is set to a value within the range of the values of the output power belonging to the linear area and is higher than the value of the output power at which the oscillation is started to be observed when the input power is decreased from a power value belonging to the saturation area to a power value belonging to the linear area. For example, the second threshold value is set to 30 dBm in the input-output characteristics of the power amplifier illustrated in FIG. 3. The second voltage value is similar to the one described above for the controller 414.

Although the first threshold value is equal to the second threshold value in the above example, the first threshold value and the second threshold value are not limited to the above setting, as in the power amplifier 400. The first threshold value may be different from the second threshold value. Although the gate bias voltage output from the gate bias generating circuit is switched between the two setting values: the first setting value and the second setting value on the basis of the first threshold value and the second threshold value, respectively, in the above example, this setting is not limitedly used, as in the power amplifier 400. For example, the gate bias voltage may be continuously varied between the two setting values near the first threshold value and the second threshold value.

As described above, in the power amplifier 600, when the input power is decreased from a power value belonging to the saturation area of the transistor 402 to a power value belonging to the linear area thereof, the decrease in the input power is detected through the detection of the output power and the gate bias voltage is set to the first voltage value described above. Accordingly, rotating the phase of the impedance at the matching point for the harmonic signal that is output in the direction in which the phase is decreased to vary the gain of the transistor in the direction in which the gain is decreased causes the harmonic signal not to meet the resonance condition of the signal between the input matching circuit 404 and the output matching circuit 406. As a result, it is possible to suppress an occurrence of the oscillation to inhibit the operation of the power amplifier 600 from being unstable due to the oscillation.

In addition, when the input power is increased to a power value belonging to the saturation area, the increase in the input power is detected through the detection of the output power and the gate bias voltage is set to the second voltage value lower than the first voltage value. Accordingly, it is possible to decrease the drain current flowing through the transistor 402. As a result, it is possible to decrease the average value of the drain current flowing through the transistor 402 during the operation period of the transistor 402 to inhibit the reduction in the reliability of the transistor 402.

3. Third Embodiment

A power amplifier according to a third embodiment will now be described.

Figure 7:
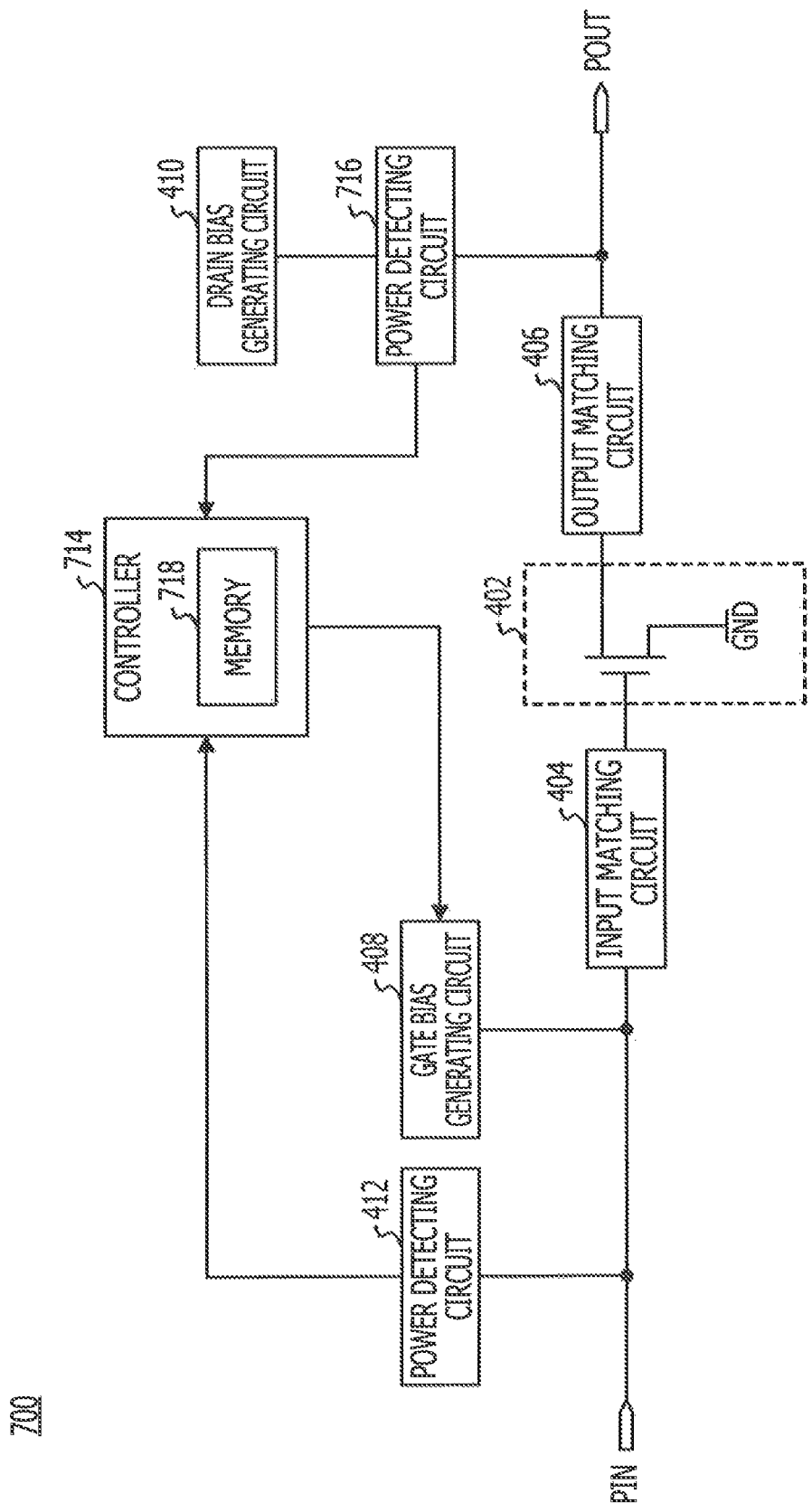
FIG. 7 illustrates an example of the configuration of a power amplifier according to a third embodiment.

FIG. 7 illustrates an example of the configuration of a power amplifier 700 according to the third embodiment, Although the power amplifier 700 illustrated in FIG. 7 differs from the power amplifier 400 illustrated in FIG. 4 in that a controller 714 is provided, instead of the controller 414, and a current detecting circuit 716 and a memory 718 storing a reference value table 802 described below are added, the configuration of the power amplifier 700 is otherwise the same as that of the power amplifier 400. The same reference numerals are used in the power amplifier 700 in FIG. 7 to identify the same or similar components in the power amplifier 400 illustrated in FIG. 4. The operations and functions of the components denoted by the same reference numerals in FIG. 7 are the same as those described above with reference to FIG. 4. A detailed description of the operations and functions of such components is omitted herein.

3-1. Determination of Whether Oscillation Occurs in Power Amplifier 700

The power of the input signal supplied to the input node Pin (the input power) is detected with the power detecting circuit 412 to monitor the input power and it is determined whether the oscillation can occur on the basis of the value of the input power in the power amplifier 400 illustrated in FIG. 4.

However, since the oscillation phenomenon is observed in the power amplifier only when the input power is decreased from a power value belonging to the saturation area of the transistor to a power value belonging to the linear area thereof and has a history (hysteresis) for the input power, as described above, the oscillation may not occur even when the input power has a power value belonging to the linear area. For example, the oscillation is not practically observed when the power value belonging to the linear area is not acquired from decrease from a power value belonging to the saturation area but is acquired from increase from a lower value belonging to the linear area.

Since the value of the gate bias voltage is set to the first voltage value when the value of the input power is lower than the first threshold value in the power amplifier 400, the gate bias voltage is set to the first voltage value even when the oscillation does not practically occur. Since it is sufficient for the gate bias voltage to be set to a voltage value (for example, the second voltage value) lower than the first voltage value when no oscillation occurs, the gate bias voltage is set to a value that is excessively high. As a result, the average level of the voltage applied to the gate during the operation period of the transistor 402 is increased to increase the average value of the drain current flowing through the transistor 402 during the operation period of the transistor 402. This accelerates the deterioration of the transistor 402 to reduce the reliability of the device.

The drain current is simply increased with the increasing input power and one-to-one relationship is established between the input power and the drain current in the transistor 402. However, the inventor found by an experiment that even the drain current corresponding to the same input power was varied between when the oscillation occurs in the power amplifier and when no oscillation occurs in the power amplifier. The inventor observed in the experiment that, even when the input signal having the same power was supplied, the value of the drain current when the oscillation occurs was lower than the value of the drain current when no oscillation occurs.

The inventor found, on the basis of the result of the experiment, that it is possible to more accurately determine whether the oscillation occurs in the power amplifier by detecting the value of the drain current in the power amplifier and comparing the detected value of the drain current with the value of the drain current when no oscillation occurs.

On the basis of the result of the experiment, in the power amplifier 700 illustrated in FIG. 7, the power of the input signal supplied to the input node Pin (the input power) is detected with the power detecting circuit 412 and a drain current of the transistor 402 (an output current from the transistor 402) is also detected. In the controller 714, information indicating the relationship between the value of the input power and the value of the drain current (drain current reference value) when no oscillation occurs is stored in the memory 718 in advance as the reference value table 802 described below.

Then, the drain current reference value corresponding to the input power is acquired from the reference value table 802 on the basis of the value of the detected power of the input signal and it is determined whether the difference value between the acquired drain current reference value and the value of the detected drain current is higher than a predetermined value. It is determined that the oscillation occurs if the difference value is higher than the predetermined value and it is determined that no oscillation occurs if the difference value is lower than the predetermined value.

3-2. Example of Configuration of Power Amplifier 700

In the power amplifier 700 illustrated in FIG. 7, the current detecting circuit 716 is electrically coupled to the drain of the transistor 402 via the output matching circuit 406 and continuously detects the drain current flowing through the drain of the transistor 402 as the average value (average drain current). The current detecting circuit 716 appropriately supplies the detected average value of the drain current to the controller 714. For example, a known ammeter can be used as the current detecting circuit 716.

The controller 714 includes the memory 718 storing the reference value table 802. The reference value table 802 indicates the relationship between the value of the input power and the value of the drain current (drain current reference value) when no oscillation occurs in the power amplifier 700 and is stored in the memory 718 in the controller 714.

FIG. 8 illustrates an example of the reference value table 802. As illustrated in FIG. 8, multiple input power values p_n and drain current reference values id_n corresponding to the respective input power values p_n are stored in the reference value table 802.

The reference value table 802 is created by performing an operation test in the power amplifier 700 before the product shipment and detecting the values of the drain current corresponding to multiple input power values acquired while increasing the power of the input signal through the operation test. As described above, the oscillation phenomenon is observed in the power amplifier only when the input power is decreased from a power value belonging to the saturation area of the transistor to a power value belonging to the linear area thereof and has a history (hysteresis) for the input power. Accordingly, in order to acquire the relationship between the input power and the drain current when no oscillation occurs, it is desired in the power amplifier 700 to sequentially detect the values of drain current corresponding the multiple input power values acquired while increasing the power of the input signal from the lower input power side in the linear area to the saturation area. The detected values of the drain current are stored as the drain current reference values in the table in association with the corresponding input power values to create the reference value table 802.

Referring back to FIG. 7, the controller 714 receives the value of the average power of the input signal from the power detecting circuit 412 and receives the average value of the drain current from the current detecting circuit 716. The controller 714 controls the output operation of the gate bias voltage, performed by the gate bias generating circuit 408, on the basis of the received value of the average power of the input signal and the received average value of the drain current.

The controller 714 determines the setting value of the gate bias voltage to be output from the gate bias generating circuit 408 on the basis of the received value of the average power of the input signal and the received average value of the drain current. The controller 714 generates voltage setting information indicating the determined setting value of the gate bias voltage and supplies the voltage setting information to the gate bias generating circuit 408. The controller 714 is realized by the same devices as in the controller 414.

The controller 714 refers to the reference value table 802 to acquire the corresponding drain current reference value on the basis of the received value of the average power of the input signal and calculates the difference value between the acquired drain current reference value and the received average value of the drain current.

The controller 714 determines that the oscillation occurs if the calculated difference value is higher than a predetermined threshold value and sets the setting value of the gate bias voltage to a first voltage value. The first voltage value is higher than a second voltage value described below in the positive voltage direction. The first voltage value is similar to the one described above for the controller 414.

The controller 714 determines that no oscillation occurs if the calculated difference value is lower than the predetermined threshold value and sets the setting value of the gate bias voltage to the second voltage value. The second voltage value is similar to the one described above for the controller 414.

The reference value table 802 is referred to in the acquisition of the corresponding drain current reference value from the detected value of the input power in the above embodiment. However, instead of the reference to the reference value table 802, a relational expression indicating the relationship between the value of the input voltage and the drain current reference value may be derived through the operation test before the product shipment, the relational expression may be stored by the controller 714, and the drain current reference value may be calculated by using the relational expression.

Although the first threshold value is equal to the second threshold value in the above example, the first threshold value and the second threshold value are not limited to the above setting, as in the power amplifier 400. The first threshold value may be different from the second threshold value. Although the gate bias voltage output from the gate bias generating circuit is switched between the two setting values: the first setting value and the second setting value on the basis of the first threshold value and the second threshold value, respectively, in the above example, this setting is not limitedly used, as in the power amplifier 400. For example, the gate bias voltage may be continuously varied between the two setting values near the first threshold value and the second threshold value.

As described above, in the power amplifier 700, the drain current is detected and the value of the detected drain current is compared with the value of the drain current (the drain current reference value) prepared in advance when no oscillation occurs to determine whether the oscillation practically occurs. In the power amplifier 700, if it is determined from the comparison that the oscillation occurs, the gate bias voltage is set to the first voltage value. Accordingly, rotating the phase of the impedance at the matching point for the harmonic signal that is output in the direction in which the phase is decreased to vary the gain of the transistor in the direction in which the gain is decreased causes the harmonic signal not to meet the resonance condition of the signal between the input matching circuit 404 and the output matching circuit 406. As a result, it is possible to suppress an occurrence of the oscillation to inhibit the operation of the power amplifier 700 from being unstable due to the oscillation.

In addition, in the power amplifier 700, if it is determined from the comparison that no oscillation occurs, the gate bias voltage is set to the second voltage value lower than the first voltage value. Accordingly, if no oscillation occurs even when the input power has a power value belonging to the linear area, the gate bias voltage can be kept at the second voltage value to decrease the drain current flowing through the transistor 402. As a result, it is possible to further decrease the average value of the drain current flowing through the transistor 402 during the operation period of the transistor 402 in the power amplifier 700, compared with the case of the power amplifier 400, to further improve the effect of inhibiting the reduction in the reliability of the transistor 402.

4. Fourth Embodiment

A power amplifier according to a fourth embodiment will now be described.

Figure 9:
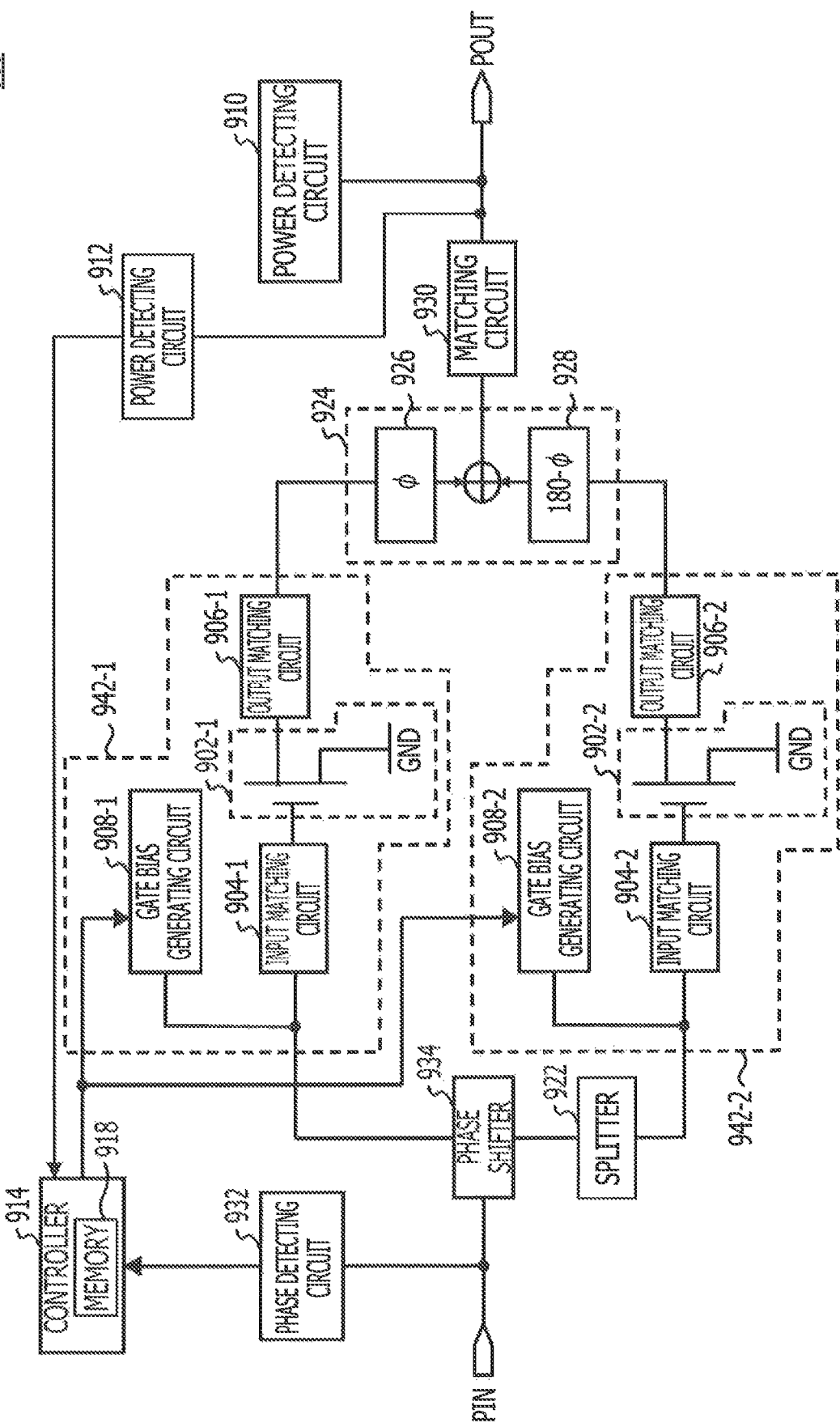
FIG. 9 illustrates an example of the configuration of a power amplifier according to a fourth embodiment.

FIG. 9 illustrates an example of the configuration of a power amplifier 900 according to the fourth embodiment. The power amplifier 900 illustrated in FIG. 9 is a power amplifier of a lossless power combiner type, which belongs to a Chireix outphasing power amplifier. The power amplifier 900 has a function to control the output operations of the gate bias voltages, performed by the gate bias generating circuits, on the basis of the power of the output signal (the output power).

The power amplifier 900 illustrated in FIG. 9 has a configuration in which two simple amplifiers, for example, the two power amplifiers 600 are combined. The power amplifier 900 includes a splitter 922, a first amplification circuit unit 942-1, a second amplification circuit unit 942-2, a drain bias generating circuit 910, a power detecting circuit 912, a combiner 924, a matching circuit 930, a phase detecting circuit 932, a phase shifter 934, and a controller 914. The controller 914 includes a memory 918 storing a reference value table described below.

In the power amplifier 900, the splitter 922 generates two input signals (a second input signal and a third input signal) on the basis of an input signal (a first input signal) supplied to the input node Pin of the power amplifier 900. The splitter 922 is realized by, for example, a hybrid-type distributed constant line. The splitter 922 supplies one (the second input signal) of the generated two input signals to the first amplification circuit unit 942-1 via the phase shifter 934. The phase shifter 934 rotates the phase of the received second input signal. The splitter 922 supplies the other input signal (the third input signal) to the second amplification circuit unit 942-2. The splitter 922 generates the second input signal and the third input signal so that the second input signal and the third input signal have the same power value belonging to the saturation area of the first amplification circuit unit 942-1 and the second amplification circuit unit 942-2 in cooperation with the phase shifter 934.

The first amplification circuit unit 942-1 includes a transistor 902-1, an input matching circuit 904-1, an output matching circuit 906-1, and a gate bias generating circuit 908-1. The second amplification circuit unit 942-2 includes a transistor 902-2, an input matching circuit 904-2, an output matching circuit 906-2, and a gate bias generating circuit 908-2.

The phase detecting circuit 932 is coupled to the phase shifter 934 and continuously detects the phase of the second input signal supplied from the phase shifter 934. The phase detecting circuit 932 appropriately supplies the value of the detected phase of the second input signal to the controller 914. The phase detecting circuit 932 is, for example, a known phase detector.

The power detecting circuit 912 is electrically coupled to the output node Pout of the power amplifier 900 and continuously detects the average power (average output power) of an output signal (a third output signal) supplied to the output node Pout from the combiner 924. The power detecting circuit 912 appropriately supplies the value of the detected average power of the third output signal to the controller 914. The power detecting circuit 912 is, for example, a known power sensor.

The inventor found by an experiment that, in the Chireix outphasing amplifier, the average power of the third output signal was varied between when the oscillation occurs in the power amplifier and when no oscillation occurs in the power amplifier even when the second input signal was rotated by the phase shifter 934 by the same phase value. It was observed in the experiment performed by the inventor that the power value of the third output signal when the oscillation occurs was shifted from the power value thereof when no oscillation occurs even when the second input signal having the same phase was supplied.

On the basis of the result of the experiment, the inventor found that it is possible to more accurately determine whether the oscillation occurs in the power amplifier by detecting the power value of the third output signal in the power amplifier and comparing the detected power value of the third output signal with the power value when no oscillation occurs.

Accordingly, the power amplifier 900 illustrated in FIG. 9 detects the phase (the input phase) of the second input signal supplied from the phase shifter 934 with the phase detecting circuit 932 and further detects the power of the third output signal (the output power). In the controller 914, information indicating the relationship between the phase of the second input signal (the input phase) and the output power (output power reference value) when no oscillation occurs is stored in the memory 918 in advance as a reference value table.

The output power reference value corresponding to the value of the input phase is acquired from the reference value table on the basis of the detected input phase and it is determined whether the difference value between the acquired output power reference value and the value of the detected output power is higher than a predetermined value. It is determined that the oscillation occurs if the difference value is higher than the predetermined value and it is determined that no oscillation occurs if the difference value is lower than the predetermined value.

The controller 914 includes the memory 918 storing the reference value table. The reference value table indicates the relationship between the value of the phase of the second input signal (the input phase) and the power value of the third output signal (the output power reference value) when no oscillation occurs in the power amplifier 900 and is stored in the memory 918 in the controller 914. The structure of the reference value table is similar to that of the reference value table 802 illustrated in FIG. 8 and stores multiple input phase values ph_n and output power reference values op_n corresponding to the respective input phase values ph_n.

The above reference value table is created by performing an operation test in the power amplifier 900 before the product shipment and detecting the values of the output power corresponding to multiple input phase values acquired while varying the input phase through the operation test. The values of the detected output power are stored as the output power reference values in the table in association with the corresponding input phase values to create the reference value table.

The controller 914 receives the value of the phase of the second input signal (the input phase) from the phase detecting circuit 932 and receives the value of the average power of the third output signal (the average output power) from the power detecting circuit 912. The controller 914 controls the output operations of the gate bias voltages, performed by the gate bias generating circuits 908-1 and 908-2, on the basis of the received value of the phase of the second input signal and the received value of the average power of the third output signal and determines the setting values of the gate bias voltages to be output from the gate bias generating circuits 908-1 and 908-2. The controller 914 generates first voltage setting information indicating the determined setting value of the gate bias voltage and supplies the first voltage setting information to the gate bias generating circuit 908-1. The controller 914 generates second voltage setting information indicating the determined setting value of the gate bias voltage and supplies the second voltage setting information to the gate bias generating circuit 908-2. The controller 914 is realized by the same devices as in the controller 414.

The controller 914 refers to the reference value table described above to acquire the corresponding output power reference value on the basis of the received value of the phase of the second input signal (the input phase value) and calculates the difference value between the acquired output power reference value and the received value of the average power of the third output signal (the average output power).

The controller 914 determines that the oscillation occurs if the calculated difference value is higher than a predetermined threshold value and sets the setting value of the gate bias voltage to a first voltage value. The first voltage value is higher than a second voltage value described below in the positive voltage direction. The first voltage value is similar to the one described above for the controller 414.

The controller 914 determines that no oscillation occurs if the calculated difference value is lower than the predetermined threshold value and sets the setting value of the gate bias voltage to the second voltage value. The second voltage value is similar to the one described above for the controller 414.

The reference value table is referred to in the acquisition of the corresponding output power reference value from the detected value of the input phase in the above embodiment. However, instead of the reference to the reference value table, a relational expression indicating the relationship between the input phase value and the output power reference value may be derived through the operation test before the product shipment, the relational expression may be stored by the controller 914, and the output power reference value may be calculated by using the relational expression.

The first amplification circuit unit 942-1 receives the second input signal from the phase shifter 934 and receives the first voltage setting information from the controller 914. The first amplification circuit unit 942-1 operates as an amplifier operating in the saturation area in cooperation with the power detecting circuit 912, the phase detecting circuit 932, the controller 914, and the drain bias generating circuit 910. The first amplification circuit unit 942-1 performs the amplification operation to the received second input signal and supplies a first output signal to the combiner 924.

The second amplification circuit unit 942-2 receives the third input signal from the splitter 922 and receives the second voltage setting information from the controller 914. The second amplification circuit unit 942-2 operates as an amplifier operating in the saturation area in cooperation with the power detecting circuit 912, the phase detecting circuit 932, the controller 914, and the drain bias generating circuit 910. The second amplification circuit unit 942-2 performs the amplification operation to the received third output signal and supplies a second output signal to the combiner 924.

The components in the first amplification circuit unit 9424, the second amplification circuit unit 942-2, the power detecting circuit 912, the controller 914, and the drain bias generating circuit 910 corresponding to those in the power amplifier 400 illustrated in FIG. 4 are denoted by the corresponding reference numerals (the reference numerals having the same lower two digits), The operations and functions of the components denoted by the corresponding reference numerals in FIG. 9 are the same as those described above with reference to FIG. 4, except for the ones specifically described in the fourth embodiment, A detailed description of the operations and functions of such components is omitted herein.

The combiner 924 includes phase shifters 926 and 928, The combiner 924 receives the output signals (the first output signal and the second output signal) from the first amplification circuit unit 942-1 and the second amplification circuit unit 942-2, respectively. In the combiner 924, the phase shifter 926 receives the first output signal from the first amplification circuit unit 942-1 to rotate the phase of the received first output signal by $\phi$. The phase shifter 928 receives the second output signal from the second amplification circuit unit 942-2 to rotate the phase of the received second output signal by $180\text{-}\phi$.

The combiner 924 combines the first output signal and the second output signal the phases of which are rotated by the phase shifters 926 and 928, respectively, by vector addition to generate the third output signal. The combiner 924 supplies the generated third output signal to the output node Pout of the power amplifier 900 via the matching circuit 930 for impedance matching with a downstream antenna.

The phase $\phi$ is a phase adjustment parameter in the vector addition of the first output signal and the second output signal in the combiner 924. The phase $\phi$ is a parameter for adjusting the shifts in phase of the first output signal and the second output signal, caused by reactance components of the first amplification circuit unit 942-1 and the second amplification circuit unit 942-2, respectively.

The matching circuit 930 is capable of being realized by a distributed constant line composed of stubs.

As described above, the power amplifier 900 detects the output power and compares the value of the detected output power with the predetermined value of the output power (the output power reference value) when no oscillation occurs to determine whether the oscillation practically occurs. In the power amplifier 900, if the comparison indicates that the oscillation occurs, the harmonic signal can be caused not to meet the resonance condition of the signal between the input matching circuit 9044 and the output matching circuit 906-1 in the first amplification circuit unit 9424 and the harmonic signal can be caused not to meet the resonance condition of the signal between the input matching circuit 9042 and the output matching circuit 906-2 in the second amplification circuit unit 942-2. As a result, it is possible to suppress an occurrence of the oscillation to inhibit the operation of the power amplifier 900 from being unstable due to the oscillation.

In addition, in the power amplifier 900, if the comparison indicates that no oscillation occurs, the gate bias voltage can be changed to a lower setting value to decrease the drain current flowing through the transistors 9024 and 902-2. As a result, it is possible to reduce the average value of the drain current flowing through the transistors 902-1 and 902-1 during the operation period thereof to inhibit the reduction in the reliability of the transistors 902-1 and 902-2.

Although the average power of the third output signal is detected by the power detecting circuit 912 in the above example, the power amplifier 900 is not limited to this configuration. A power detecting circuit may be electrically coupled to the output node of each of the first amplification circuit unit 942-1 and the second amplification circuit unit 942-2 to detect the average power of the first output signal and the second output signal input into the combiner 924. In this case, the output operations of the gate bias voltages in the gate bias generating circuits 908-1 and 908-2 are controlled by the controller 914 on the basis of the value of the average power of the first output signal and the second output signal, respectively,

5. Fifth Embodiment

A power amplifier according to a fifth embodiment will now be described.

Figure 10:
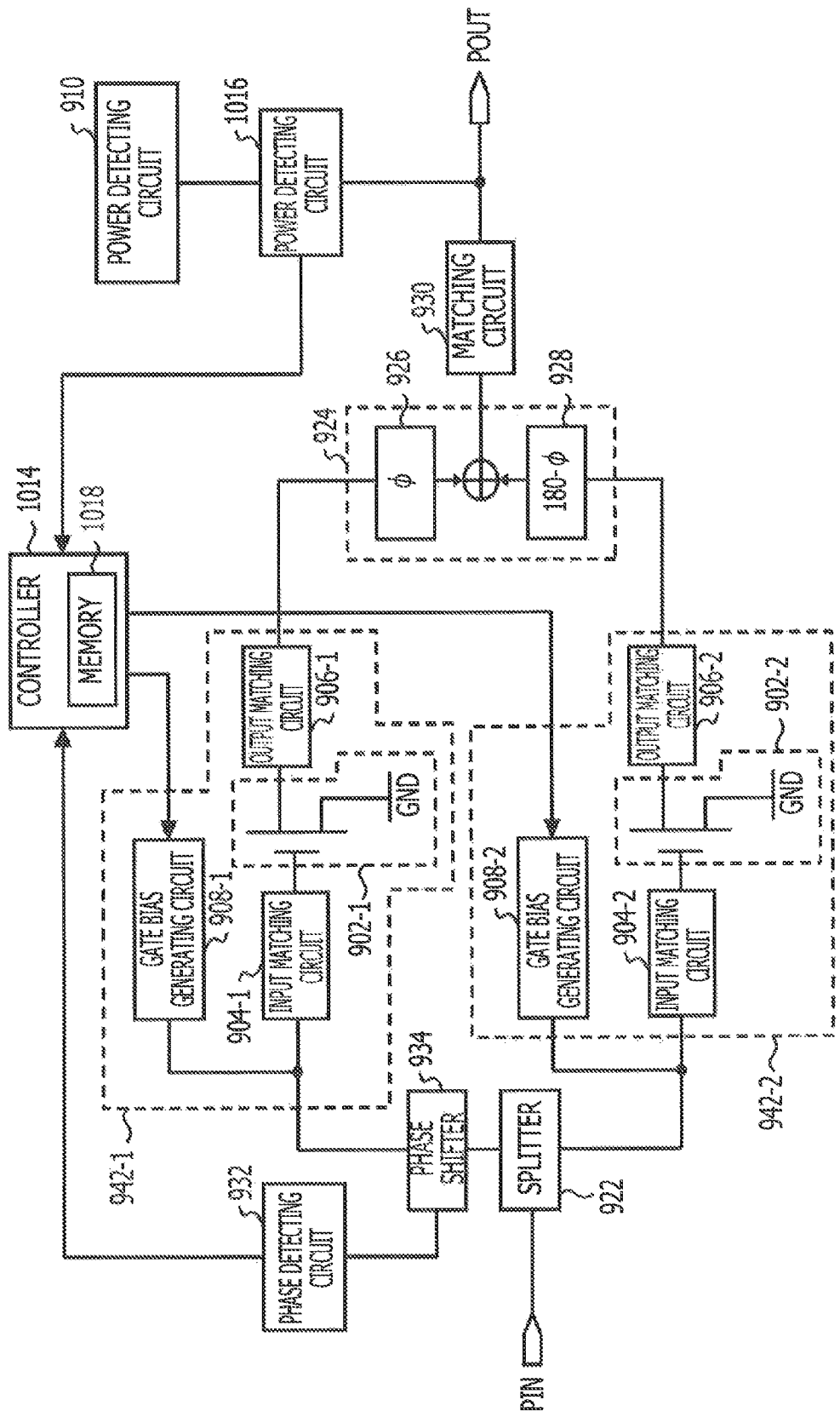
FIG. 10 illustrates an example of the configuration of a power amplifier according to a fifth embodiment.

FIG. 10 illustrates an example of the configuration of a power amplifier 1000 according to the fifth embodiment. The power amplifier 1000 illustrated in FIG. 10 is a power amplifier of a lossless power combiner type, which belongs to a Chireix outphasing power amplifier. The power amplifier 1000 has a function to control the output operations of the gate bias voltages, performed by the gate bias generating circuits, on the basis of the drain current of the transistor (the output current from the transistor).

The power amplifier 1000 illustrated in FIG. 10 has a configuration in which two simple amplifiers, for example, the two power amplifiers 700 are combined. Although the power amplifier 1000 illustrated in FIG. 10 differs from the power amplifier 900 illustrated in FIG. 9 in that a controller 1014 and a memory 1018 are provided, instead of the controller 1014 and the memory 918, and a current detecting circuit 1016 is provided, instead of the power detecting circuit 912, the configuration of the power amplifier 1000 is otherwise the same as that of the power amplifier 900. The other components are the same as the ones in the power amplifier 900 illustrated in FIG. 9. The same reference numerals are used in the power amplifier 1000 in FIG. 10 to identify the same or similar components in the power amplifier 900 illustrated in FIG. 9. The operations and functions of the components denoted by the same reference numerals in FIG. 10 are the same as those described above with reference to FIG. 9, except for the ones specifically described in the fifth embodiment. A detailed description of the operations and functions of such components is omitted herein.

In the power amplifier 1000, the current detecting circuit 1016 is electrically coupled to the drains of the transistors 902-1 and 902-2 via the output matching circuits 906-1 and 906-2, the combiner 924, and the matching circuit 930, as in the current detecting circuit 716 illustrated in FIG. 7, and continuously detects the drain current (the sum) flowing through the drains of the transistors 902-1 and 902-2 as the average value (average drain current). The current detecting circuit 1016 appropriately supplies the detected average value of the drain current to the controller 1014. For example, a known ammeter can be used as the current detecting circuit 1016.

The inventor found by an experiment that, in the Chireix outphasing amplifier, the drain current (the sum) flowing through the drains of the transistors 902-1 and 902-2 was varied between when the oscillation occurs in the power amplifier and when no oscillation occurs in the power amplifier even when the second input signal is rotated by the phase shifter 934 by the same phase value. It was observed in the experiment performed by the inventor that the value of the drain current when the oscillation occurs was shifted from the value of the drain, current when no oscillation occurs even when the second input signal having the same phase was supplied.

On the basis of the result of the experiment, the inventor found that it is possible to more accurately determine whether the oscillation occurs in the power amplifier by detecting the value of the drain current in the power amplifier and comparing the detected value of the drain current with the value of the drain current when no oscillation occurs.

Accordingly, the power amplifier 1000 illustrated in FIG. 10 detects the phase (the input phase) of the second input signal supplied from the phase shifter 934 with the phase detecting circuit 932 and further detects the drain current (the output current). In the controller 1014, information indicating the relationship between the phase of the second input signal (the input phase) and the output current (output current reference value) when no oscillation occurs is stored in the memory 1018 in advance as a reference value table.

The output current reference value corresponding to the value of the input phase is acquired from the reference value table on the basis of the detected input phase and it is determined whether the difference value between the acquired output current reference value and the value of the detected output current is higher than a predetermined value. It is determined that the oscillation occurs if the difference value is higher than the predetermined value and it is determined that no oscillation occurs if the difference value is lower than the predetermined value.

The controller 1014 includes the memory 1018 storing the reference value table. The reference value table indicates the relationship between the value of the phase of the second input signal (the input phase) and the value of the output current (the output current reference value) when no oscillation occurs in the power amplifier 1000 and is stored in the memory 1018 in the controller 1014. The structure of the reference value table is similar to that of the reference value table 802 illustrated in FIG. 8 and stores multiple input phase values ph_n and output current reference values oc_n corresponding to the respective input phase values ph_n.

The above reference value table is created by performing an operation test in the power amplifier 1000 before the product shipment and detecting the values of the output current corresponding to multiple input phase values acquired while varying the input phase through the operation test. The values of the detected output current are stored as the output current reference values in the table in association with the corresponding input phase values to create the reference value table.

The controller 1014 receives the value of the phase of the second input signal (the input phase) from the phase detecting circuit 932 and receives the average value of the drain current (the output current) from the current detecting circuit 1016. The controller 1014 controls the output operations of the gate bias voltages, performed by the gate bias generating circuits 908-1 and 908-2, on the basis of the received value of the phase of the second input signal and the received average value of the output current and determines the setting values of the gate bias voltages to be output from the gate bias generating circuits 908-1 and 908-2. The controller 1014 generates first voltage setting information indicating the determined setting value of the gate bias voltage and supplies the first voltage setting information to the gate bias generating circuit 908-1. The controller 1014 generates second voltage setting information indicating the determined setting value of the gate bias voltage and supplies the second voltage setting information to the gate bias generating circuit 908-2.

The first amplification circuit unit 942-1 receives one (the second input signal) of the two input signals generated by the splitter 922 on the basis of the input signal (the first input signal) supplied to the input node Pin of the power amplifier 1000 from the phase shifter 934 and receives the first voltage setting information from the controller 1014. The first amplification circuit unit 942-1 operates as an amplifier operating in the saturation area in cooperation with the phase detecting circuit 932, the current detecting circuit 1016, the controller 1014, and the drain bias generating circuit 910. The first amplification circuit unit 942-1 performs the amplification operation to the received second input signal and supplies the first output signal to the combiner 924.

The second amplification circuit unit 942-2 receives the other input signal (the third input signal) from the splitter 922 and receives the second voltage setting information from the controller 1014. The second amplification circuit unit 942-2 operates as an amplifier operating in the saturation area in cooperation with the phase detecting circuit 932, the current detecting circuit 1016, the controller 1014, and the drain bias generating circuit 910. The second amplification circuit unit 942-2 performs the amplification operation to the received third output signal and supplies the second output signal to the combiner 924.

As described above, the power amplifier 1000 detects the drain current (the output current) and compares the value of the detected drain current with the predetermined value of the output current (the output current reference value) when no oscillation occurs to determine whether the oscillation practically occurs. If the comparison indicates that the oscillation occurs, the harmonic signal can be caused not to meet the resonance condition of the signal between the input matching circuit 904-1 and the output matching circuit 9064 in the first amplification circuit unit 942-1 and the harmonic signal can be caused not to meet the resonance condition of the signal between the input matching circuit 904-2 and the output matching circuit 906-2 in the second amplification circuit unit 942-2, As a result, it is possible to suppress an occurrence of the oscillation to inhibit the operation of the power amplifier 1000 from being unstable due to the oscillation.

In addition, in the power amplifier 1000, if the comparison indicates that no oscillation occurs, the gate bias voltage can be changed to a lower setting value to decrease the drain current flowing through the transistors 902-1 and 902-2. As a result, it is possible to reduce the average value of the drain current flowing through the transistors 902-1 and 9024 during the operation period thereof to inhibit the reduction in the reliability of the transistors 902-1 and 902-2.

Although the sum of the drain current flowing through the transistors 902-1 and 902-2 is detected by the current detecting circuit 1016 in the above example, the power amplifier 1000 is not limited to this configuration. A current detecting circuit may be electrically coupled to each of the two input nodes of the combiner 924 to individually detect the drain current flowing through the transistors 902-1 and 902-2. In this case, the output operations of the gate bias voltages in the gate bias generating circuits 908-1 and 908-2 are controlled by the controller 1014 on the basis of the values of the drain current flowing through the transistors 902-1 and 902-2, respectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power amplifier comprising:
a first matching circuit configured to perform harmonic processing of an input signal;
a second matching circuit configured to perform the harmonic processing of an output signal, the output signal being generated by amplifying a power of the input signal; and
a controller configured to set a phase of output impedance at a matching point of the harmonic included in the generated output signal to a first phase when the power of the input signal is higher than a first threshold value, and set the phase of output impedance at the matching point of the harmonic included in the generated output signal to a second phase when the power of the input signal is lower than a second threshold value, wherein the second phase is lower than the first phase, and the second threshold value is lower or equal to the first threshold value.

2. The power amplifier according to claim 1, further comprising:
a transistor configured to generate the output signal and including a gate and a drain, and
a bias generator configured to supply a bias voltage to the gate, wherein the controller is configured to control the bias generator to supply a first bias voltage, when the power of the input signal is higher than the first threshold value, and supply a second bias voltage, the second bias voltage being higher than the first bias voltage, when the power of the input signal is lower than the second threshold value.

3. The power amplifier according to claim 2, wherein the first threshold value and the second threshold value are input power values belonging to an area having linear characteristic between input power into the transistor and output power from the transistor.

4. The power amplifier according to claim 1, wherein each of the first matching circuit and the second matching circuit include a distributed constant line including a plurality of stubs.

5. A power amplifier, comprising:
a first matching circuit configured to perform harmonic processing of an input signal;
a second matching circuit configured to perform harmonic processing of an output signal, the output signal being generated by amplifying a power of the input signal; and
a controller configured to set a phase of output impedance at a matching point of the harmonic included in the generated output signal to a first phase when the power of the output signal is higher than a first threshold value, and set the phase of output impedance at the matching point of the harmonic included in the generated output signal to a second phase when the power of the output signal is lower than a second threshold value, wherein the second phase is lower than the first phase, and the second threshold value is lower or equal to the first threshold value.

6. The power amplifier according to claim 5, further comprising:
a transistor configured to generate the output signal and including a gate and a drain, and
a bias generator configured to supply a bias voltage to the gate of the transistor, wherein the controller is configured to control the bias generator to supply a first bias voltage, when the power of the output signal is higher than the first threshold value, and supply a second bias voltage, the second bias voltage being higher than the first bias voltage, when the power of the output signal is lower than the second threshold value.

7. The power amplifier according to claim 6, wherein the first threshold value and the second threshold value are output power values belonging to an area having linear characteristic between input power into the transistor and output power from the transistor.

8. The power amplifier according to claim 5, wherein each of the first matching circuit and the second matching circuit include a distributed constant line including a plurality of stubs.

9. A power amplifier, comprising:
a first matching circuit configured to perform harmonic processing of an input signal;

a second matching circuit configured to perform harmonic processing of an output signal, the output signal being generated by amplifying a power of the input signal; and a controller configured to set a phase of output impedance at a matching point of the harmonic included in the generated output signal to a first phase when a difference between a value of an output current and a reference value is greater than a first threshold value, and set the phase of output impedance at the matching point of the harmonic included in the generated output signal to a second phase when the difference between the value of the output current and the reference value is smaller than a second threshold value, wherein the second phase is lower than the first phase, and the second threshold value is lower or equal to the first threshold value.

10. The power amplifier according to claim 9, further comprising:

a transistor configured to generate the output signal and including a gate and a drain, and a bias generator configured to supply a bias voltage to the gate, wherein the controller is configured to control the bias generator to: supply a first bias voltage, when the difference between the value of the output current and the reference value is larger than the first threshold value, and supply a second bias voltage to the gate, the second bias voltage being lower than the first bias voltage, when the difference between the value of the output current and the reference value is smaller than the second threshold value.

11. The power amplifier according to claim 10, further comprising:

a memory that stores reference value information indicating a relationship between a power value of the input signal and a value of the output current when the power amplifier normally operates, and wherein the power amplifier determines the reference value by acquiring a value of an output power corresponding to the power value of the input signal received at an input node from the reference value information.

12. The power amplifier according to claim 9, wherein each of the first matching circuit and the second matching circuit include a distributed constant line including a plurality of stubs.

13. A power amplifier comprising:

a splitter configured to receive a first input signal including a fundamental wave and a harmonic and generate a second input signal and a third input signal each including the fundamental wave and the harmonic based on the received first input signal;

a first matching circuit configured to perform harmonic processing of the second input signal;

a second matching circuit configured to perform harmonic processing of a first output signal, the first output signal being generated by amplifying a power of the second input signal;

a third matching circuit configured to perform harmonic processing of the second input signal;

a fourth matching circuit configured to perform harmonic processing of a second output signal, the second output signal being generated by amplifying a power of the third input signal; and a combiner configured to combine the first output signal and the second output signal to generate a third output signal, wherein:

a phase of output impedance at a matching point of the harmonic included in the generated first output signal is set to a first phase when an output power of the third output signal is higher than a first threshold value, and set to a second phase when the output power of the third output signal is lower than a second threshold value, the second phase being lower than the first phase, the second threshold value being lower or equal to the first threshold value; and a phase of output impedance at a matching point of the harmonic included in the generated second output signal is set to the first phase when the output power of the third output signal is higher than the first threshold value, and set to the second phase when the output power of the third output signal is lower than the second threshold value.

14. The power amplifier according to claim 13, further comprising:

a first transistor including a first gate and a first drain;

a first bias generator configured to supply a first bias voltage to the first gate when a difference between a value of an output power and a reference value is larger than a first threshold value, and supply a second bias voltage to the first gate, the second bias voltage being lower than the first bias voltage, when the difference between the value of the output power and the reference value is smaller than a second threshold value;

a second transistor including a second gate and a second drain; and a second bias generator configured to supply a third bias voltage to the second gate when the difference between the value of the output power and the reference value is larger than the first threshold value, and supply a fourth bias voltage to the second gate, the fourth bias voltage being lower than the third voltage value, when the difference between the value of the output power and the reference value is smaller than the second threshold value.

15. The power amplifier according to claim 14, further comprising:

a memory that stores reference value information indicating a relationship between a phase value of the second input signal and a value of the output power when the power amplifier normally operates, and wherein the power amplifier determines the reference value by acquiring the value of the output power corresponding to the phase value of the second input signal from the reference value information.

16. A power amplifier comprising:

a splitter configured to receive a first input signal including a fundamental wave and a harmonic and generate a second input signal and a third input signal each including the fundamental wave and the harmonic based on the received first input signal;

a first matching circuit configured to perform harmonic processing of the second input signal;

a second matching circuit configured to perform harmonic processing of a first output signal, the first output signal being generated by amplifying a power of the second input signal;

a third matching circuit configured to perform harmonic processing of the third input signal;

a fourth matching circuit configured to perform harmonic processing of a second output signal, the second output signal being generated by amplifying a power of the third input signal; and a combiner configured to combine the first output signal and the second output signal to generate a third output signal, wherein:

a phase of output impedance at a matching point of the harmonic included in the generated first output signal is set to a first phase when a different between a value of an output current of the combiner and a reference value is larger than a first threshold value, and set to a second phase when the difference between the value of the output current and the reference value is smaller than a second threshold value, the second phase being lower than the first phase, the second threshold value being lower or equal to the first threshold value; and a phase of output impedance at a matching point of the harmonic included in the generated second output signal is set to the first phase when the difference between the output current and the reference value is larger than the first threshold value, and set to the second phase when the difference between the output current and the reference value is smaller than the second threshold value.

17. The power amplifier according to claim 16, further comprising:

a first transistor including a first gate and a first drain;

a first bias generator configured to: supply a first bias voltage to the first gate when the difference between the value of the output current and the reference value is larger than the first threshold value, and supply a second bias voltage to the first gate, the second bias voltage being lower than the first bias voltage, when the difference between the value of the output current and the reference value is smaller than the second threshold value;

a second transistor including a second gate and a second drain;

a second bias generator configured to: supply a third bias voltage to the second gate when the difference between the value of the output current and the reference value is larger than the first threshold value, and supply a fourth bias voltage to the second gate, the fourth bias voltage being lower than the third bias voltage, when the difference between the value of the output current and the reference value is smaller than the second threshold value.

18. The power amplifier according to claim 17, further comprising:

a memory that stores reference value information indicating a relationship between a phase value of the second input signal and a value of the output current when the power amplifier normally operates, and wherein the power amplifier determines the reference value by acquiring the value of the output current corresponding to the phase value of the second input signal from the reference value information.

* * * * *